(12) United States Patent
Wada et al.

(10) Patent No.: US 11,843,875 B2
(45) Date of Patent: Dec. 12, 2023

(54) PHOTOELECTRIC CONVERSION APPARATUS

(71) Applicant: CANON KABUSHIKI KAISHA, Tokyo (JP)

(72) Inventors: Yoichi Wada, Kanagawa (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 90 days.

(21) Appl. No.: 17/588,010

(22) Filed: Jan. 28, 2022

(65) Prior Publication Data

US 2022/0247979 A1  Aug. 4, 2022

(30) Foreign Application Priority Data

Feb. 4, 2021  (JP) .................................. 2021-016451

(51) Int. Cl.
| | | |
|---|---|---|
| *H04N 25/11* | (2023.01) | |
| *H01L 27/146* | (2006.01) | |
| *G06N 3/08* | (2023.01) | |

(52) U.S. Cl.
CPC ....... *H04N 25/11* (2023.01); *H01L 27/14621* (2013.01); *H01L 27/14634* (2013.01); *H01L 27/14645* (2013.01); *G06N 3/08* (2013.01)

(58) Field of Classification Search
CPC .. H04N 25/11; H04N 23/84; H01L 27/14621; H01L 27/14634; H01L 27/14645; H01L 27/1463; G06N 3/08; G06N 3/045
See application file for complete search history.

(56) References Cited

U.S. PATENT DOCUMENTS

| | | | | |
|---|---|---|---|---|
| 10,027,901 | B2* | 7/2018 | Venkataraman | ............................ H01L 27/14618 |
| 10,257,484 | B2* | 4/2019 | Otsubo | ............. H01L 27/14868 |
| 2018/0115752 | A1* | 4/2018 | Sato | ...................... H04N 25/131 |
| 2018/0270462 | A1* | 9/2018 | Otsubo | ................... G02B 5/201 |
| 2019/0057495 | A1* | 2/2019 | Shionoya | ............... G06T 3/4015 |
| 2020/0382616 | A1* | 12/2020 | Vaishampayan | ........ H04L 67/59 |
| 2021/0044742 | A1* | 2/2021 | Berkovich | ............. H04N 25/50 |
| 2021/0097675 | A1* | 4/2021 | Koga | ........................ G06N 3/08 |
| 2021/0142086 | A1* | 5/2021 | Berkovich | ........... G06V 10/141 |
| 2021/0266489 | A1* | 8/2021 | Wada | ................... H04N 25/616 |
| 2021/0306586 | A1* | 9/2021 | Yamamoto | ........... H04N 25/445 |

FOREIGN PATENT DOCUMENTS

JP  2020025263 A  2/2020

\* cited by examiner

*Primary Examiner* — Lin Ye
*Assistant Examiner* — John H Morehead, III
(74) *Attorney, Agent, or Firm* — CANON U.S.A., INC. IP Division

(57) ABSTRACT

A photoelectric conversion apparatus has a first filter arranged so as to correspond to a first photoelectric conversion unit and a second filter arranged so as to correspond to a second photoelectric conversion unit. The photoelectric conversion apparatus has a first processing unit configured to process an output signal from the first photoelectric conversion unit and having a first learned model, and a second processing unit configured to process an output signal from the second photoelectric conversion unit and having a second learned model different from the first learned model.

16 Claims, 14 Drawing Sheets

PHOTOELECTRIC CONVERSION APPARATUS

BACKGROUND

Field of the Disclosure

The aspect of the embodiments relates to an arrangement of signal processing units included in a photoelectric conversion apparatus.

Description of the Related Art

In recent years, it is desired that advanced signal processing be executed inside a photoelectric conversion apparatus from the viewpoint of, for example, supporting an increasing variety of image processing and increasing the speed of image processing.

Japanese Patent Laid-Open No. 2020-25263 describes a multilayer photoelectric conversion apparatus in which a first substrate and a second substrate are stacked one on top of the other. The first substrate is provided with a photoelectric conversion region having a plurality of photoelectric conversion units (an image capturing unit). The second substrate is provided with a processing unit configured to perform signal processing on signals obtained from a pixel array arranged on the first substrate. In this processing unit, a learned model, which is a program related to machine learning, is stored, and signal processing based on a neural network calculation model can be performed. Thus, more advanced signal processing than before can be performed inside the photoelectric conversion apparatus.

SUMMARY OF THE DISCLOSURE

A photoelectric conversion apparatus includes a photoelectric conversion region in which a plurality of photoelectric conversion units are arranged, a first filter arranged so as to correspond to a first photoelectric conversion unit among the plurality of photoelectric conversion units, a second filter arranged so as to correspond to a second photoelectric conversion unit among the plurality of photoelectric conversion units and having a different optical property from the first filter, a first processing unit configured to process an output signal from the first photoelectric conversion unit and having a first learned model, and a second processing unit configured to process an output signal from the second photoelectric conversion unit and having a second learned model different from the first learned model.

Further features of the disclosure will become apparent from the following description of exemplary embodiments with reference to the attached drawings.

DESCRIPTION OF THE EMBODIMENTS

Figure 1:
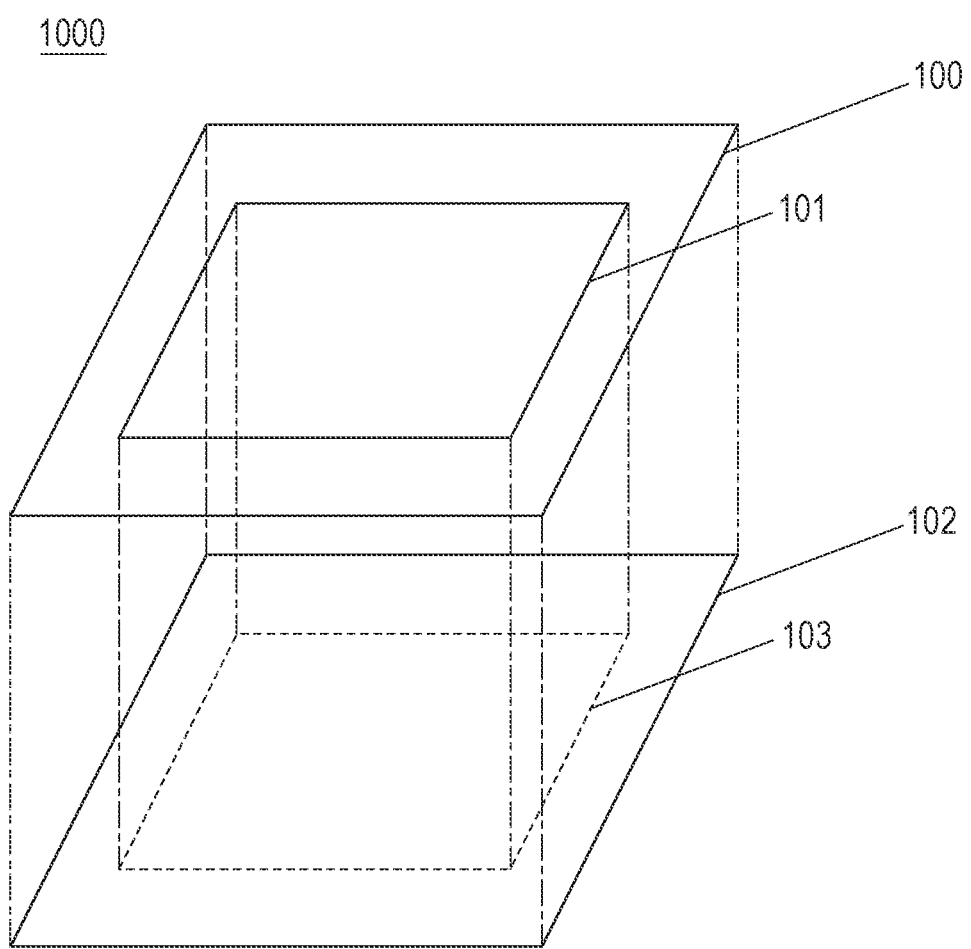
FIG. 1 is a diagram of the configuration of a photoelectric conversion apparatus according to a first embodiment.

In Japanese Patent Laid-Open No. 2020-25263, there is provided only one processing unit that performs processing based on a learned model. This may cause the processing speed of the processing unit to decrease or the load of the processing unit to increase. When compared with the processing unit in Japanese Patent Laid-Open No. 2020-25263, the disclosure provides a photoelectric conversion apparatus including an improved processing unit that performs processing based on a learned model.

In the following, embodiments of the present disclosure will be described in detail with reference to the drawings. In the following embodiments, identical portions will be denoted by the same reference numeral, and redundant description will be omitted. In the present specification, "in a plan view" refers to viewing from a direction orthogonal to a light incident surface of a first substrate.

First Embodiment

A first embodiment will be described using FIGS. 1 to 3.

FIG. 1 is a diagram of the configuration of a photoelectric conversion apparatus 1000 according to the present embodiment. In FIG. 1, the photoelectric conversion apparatus 1000 includes a first substrate 100 and a second substrate 102. The first substrate 100 and the second substrate 102 are stacked one on top of the other.

The first substrate 100 has a plurality of photoelectric conversion units including photodiodes. The plurality of photoelectric conversion units are two-dimensionally arranged in a photoelectric conversion region 101. In a case where the photoelectric conversion units are used for image capturing, the "photoelectric conversion region" may also be referred to as an "imaging region". Indeed, there may be a case where the photoelectric conversion units are used in, for example, distance measurement other than image formation, and thus the photoelectric conversion region is a generic concept of an imaging region.

A signal from the photoelectric conversion region 101 is output to the second substrate 102. In this case, the photoelectric conversion region 101 has a plurality of pixels. Each pixel may have a photoelectric conversion unit and a pixel circuit that reads out an electric charge generated by the photoelectric conversion unit. For example, the pixel circuit may include a transfer transistor, an amplification transistor, a reset transistor, a selection transistor, or a capacitor switching transistor. Alternatively, a plurality of photoelectric conversion units including avalanche photodiodes (APDs) may be arranged in the photoelectric conversion region 101. Furthermore, the APDs may be single-photon avalanche diodes (SPADs). For example, in a case where SPADs are used, the photoelectric conversion region 101 has photoelectric conversion units including SPADs. Moreover, in a case where SPADs are used, not the first substrate 100 but the second substrate 102 is provided with pixel circuits that read out outputs from the photoelectric conversion units.

On the second substrate 102, as described later, an analog-to-digital converter (ADC), a controller, a signal processing unit, a digital signal processor (DSP), a memory, and so forth are arranged. An interface circuit or a driver circuit may be arranged on the second substrate 102, the interface circuit and the driver circuit being not illustrated.

To bond the first substrate 100 and the second substrate 102 together, each of the first substrate 100 and the second substrate 102 is divided into pieces (chips). Thereafter, the pieces of the first substrate 100 and those of the second substrate 102 can be bonded together. That is, a Chip-on-Chip (CoC) method may be used. Alternatively, one out of the first substrate 100 and the second substrate 102 (for example, the first substrate 100) is divided into pieces (chips). Thereafter, the pieces of the first substrate 100 and the second substrate 102, which is not divided into pieces (that is, in a wafer state), can be bonded together.

That is, a Chip-on-Wafer method (CoW) may be used. Alternatively, a method may be used in which the first substrate 100 and the second substrate 102, which are both in a wafer state, are bonded together. That is, a Wafer-on-Wafer (WoW) method may be used.

In a method for bonding the first substrate 100 and the second substrate 102 together, for example, plasma bonding or the like can be used. Note that the bonding method is not limited thereto, and various bonding methods may be used.

To electrically connect the first substrate 100 and the second substrate 102 to each other, for example, two through-silicon vias (TSVs), which are a TSV provided in the first substrate 100 and a TSV provided from the first substrate 100 to the second substrate 102, may be connected to each other at a chip outer surface. That is, a so-called twin TSV method can be used. Moreover, a so-called shared TSV method or the like can be employed with which the first substrate 100 and the second substrate 102 are connected to each other using a common TSV provided from the first substrate 100 to the second substrate 102. Furthermore, various connection forms using a so-called Cu—Cu bonding method or the like can be employed with which copper (Cu) exposed from a bonding surface of the first substrate 100 and copper (Cu) exposed from a bonding surface of the second substrate 102 are bonded together.

Figure 2:
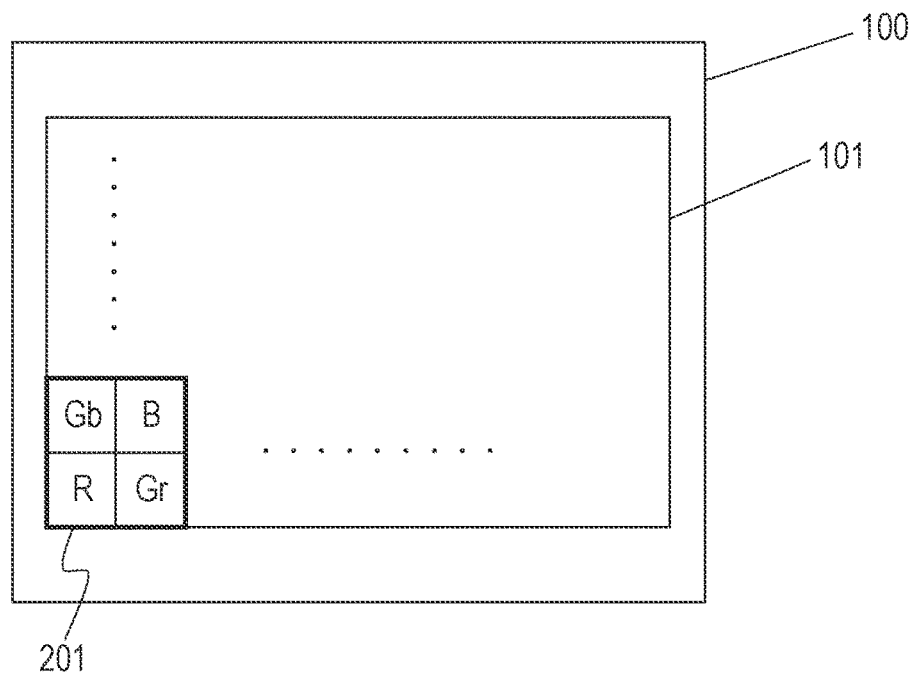
FIG. 2 is a plan view of a first substrate of the photoelectric conversion apparatus according to the first embodiment.

FIG. 2 is a plan view of the first substrate 100 in FIG. 1. In FIG. 2, the first substrate 100 is provided with the photoelectric conversion region 101, which includes the plurality of photoelectric conversion units. Color filters 201 are provided on the light reception side of the photoelectric conversion units, namely above the photoelectric conversion units. In FIG. 2, a red color filter (R), green color filters (Gb, Gr), and a blue color filter (B) are illustrated. Color filters of different colors differ from each other in terms of optical properties, for example, transmittance properties with respect to wavelengths. Although not illustrated, the arrangement of these color filters forms one block, and blocks of these color filters are two-dimensionally arranged in the up-down and left-right directions.

Each color filter 201 may be provided so as to correspond to one photoelectric conversion unit or two or more photoelectric conversion units. Above the color filters 201, microlenses (not illustrated) are provided. Each microlens may be provided so as to correspond to one color filter or two or more color filters. For example, in a case of the Quad Bayer pattern, one microlens is provided for four color filters.

Figure 3:
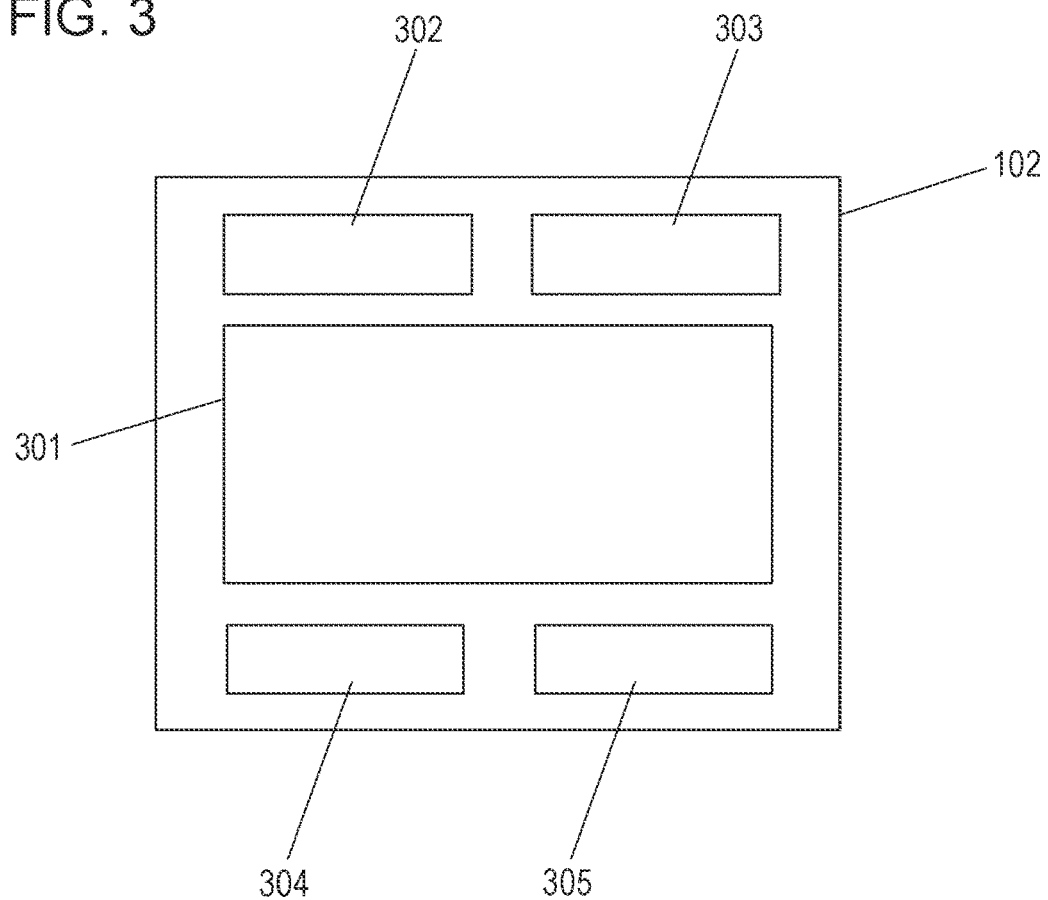
FIG. 3 is a plan view of a second substrate of the photoelectric conversion apparatus according to the first embodiment.

FIG. 3 is a plan view of the second substrate 102. The second substrate 102 has a read-out circuit 301, which is provided in a region including and around the center of the second substrate 102. Signals output from the read-out circuit 301 are input to a first artificial intelligence (AI) processing unit 302, a second AI processing unit 303, a third AI processing unit 304, and a fourth AI processing unit 305.

In this case, the first AI processing unit 302 processes outputs from the photoelectric conversion units corresponding to the red color filters (R). The second AI processing unit 303 processes outputs from the photoelectric conversion units corresponding to the green color filters (Gb). Furthermore, the third AI processing unit 304 processes outputs from the photoelectric conversion units corresponding to the green color filters (Gr). In addition, the fourth AI processing unit 305 processes outputs from the photoelectric conversion units corresponding to the blue color filters (B).

Figure 4:
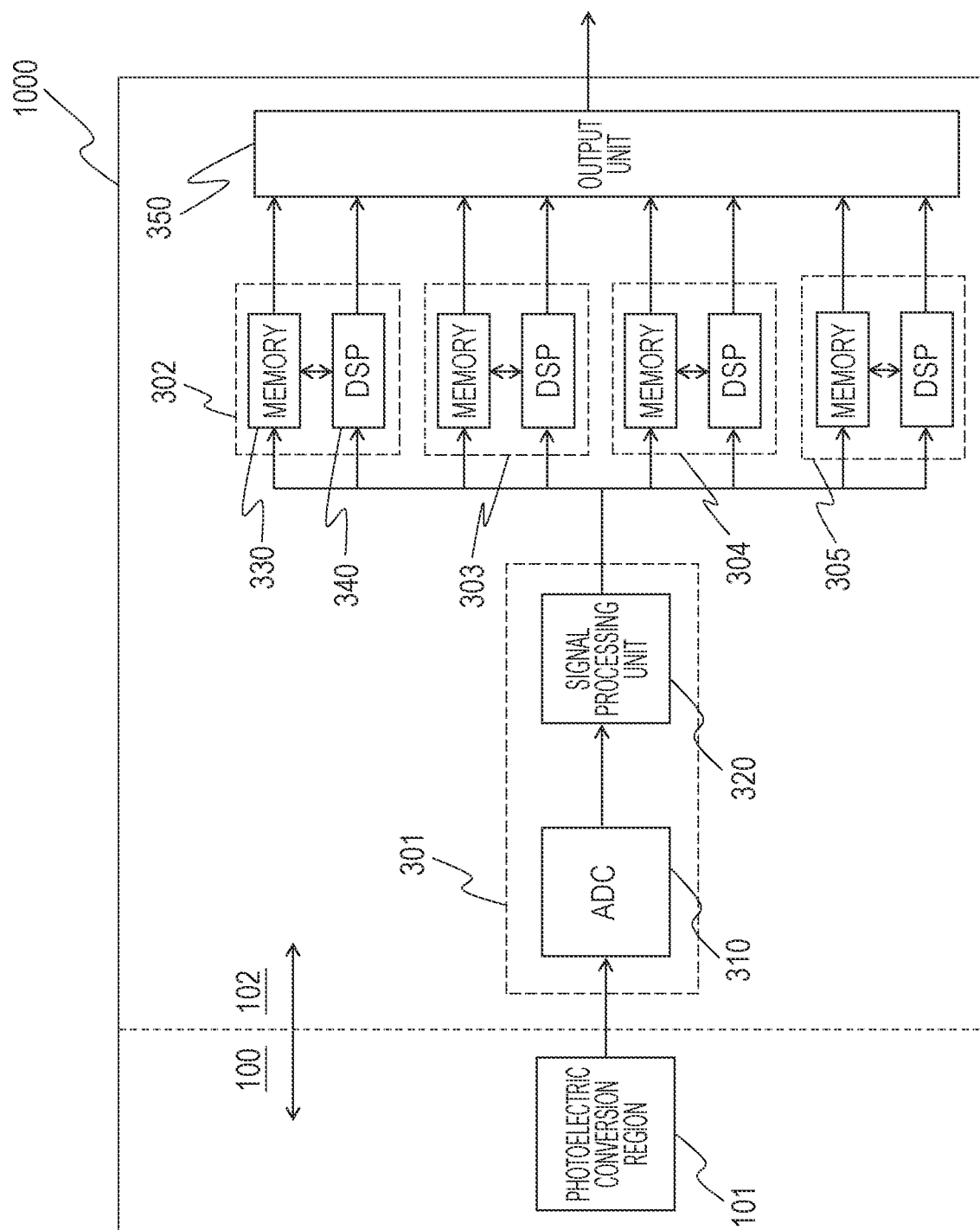
FIG. 4 is a block diagram of the photoelectric conversion apparatus according to the first embodiment.

FIG. 4 is a block diagram in which the items described using FIGS. 1 to 3 are illustrated again using blocks. In FIG. 4, the plan view illustrated in FIG. 3 is illustrated in more details.

In FIG. 4, the photoelectric conversion region 101 is provided on the first substrate 100 side, signals output from the photoelectric conversion units of the photoelectric conversion region 101 are input to the second substrate 102 side through a wiring line.

The signals output from the photoelectric conversion units are input to the read-out circuit 301 provided on the second substrate 102. The read-out circuit 301 is provided with an analog-to-digital conversion circuit (ADC circuit) 310 and a signal processing unit 320.

Signals output from the read-out circuit 301 are input to the AI processing units 302 to 305. Each AI processing unit includes a memory 330 and a DSP 340. An output from each AI processing unit is input to an output unit 350 and is then output to the outside of the photoelectric conversion apparatus 1000.

The ADC circuit 310 converts an analog signal into a digital value to generate digital data. The ADC circuit 310 may include, for example, a voltage generation circuit that generates a driving voltage for driving elements in the photoelectric conversion region. Digital data generated by the ADC circuit 310 is output to the signal processing unit 320. FIG. 4 is illustrated such that signals output from the plurality of photoelectric conversion units provided in the photoelectric conversion region 101 are processed by one ADC circuit 310. However, each of the plurality of photoelectric conversion units may be provided with one ADC circuit 310. Alternatively, blocks into which the plurality of photoelectric conversion units are divided may each be provided with one ADC circuit 310. Any form is possible.

The signal processing unit 320 performs various types of signal processing on digital data input from the ADC circuit 310. For example, in a case where data to be processed is a color image, the signal processing unit 320 performs a format conversion on the data concerning this color image into YUV image data, RGB image data, or the like. The signal processing unit 320 performs, for example, processing such as noise reduction or white balance adjustment on image data, which is a processing target, as needed. In addition, in one embodiment, the signal processing unit 320 performs, on image data to be processed, various types of signal processing (also called preprocessing) that are necessary in a case where the DSP 340 processes the image data.

The DSP 340 performs various types of processing using a learned model (also called a neural network calculation model) by executing, for example, a program stored in the memory 330. The learned model is generated, for example, through machine learning using a deep neural network (DNN). The learned model may be designed on the basis of parameters generated by inputting, to a certain machine learning model, an input signal corresponding to an output from the photoelectric conversion region 101 and training data associated with a label corresponding to the input signal. The certain machine learning model may be a learning model using a multilayer neural network (also called a multilayer neural network model).

For example, the DSP 340 performs processing for multiplying data by a coefficient stored in the memory 330 by executing processing based on the learned model stored in the memory 330. A result obtained by performing such processing (an arithmetic operation result) is output to the memory 330, the output unit 350, or both the memory 330 and the output unit 350. The arithmetic operation result may include image data obtained by performing processing using the learned model or various types of information (metadata) obtained from the image data. A memory controller that controls access to the memory 330 may be built in the DSP 340.

Data to be processed by the DSP 340 may be data read out from the photoelectric conversion region 101 or data obtained by reducing the data size of the read-out data by dropping some of the pixels of the read-out data at certain intervals. Alternatively, data concerning all the pixels of the photoelectric conversion region 101 is not read out, and data concerning pixels obtained by dropping some of all the pixels at certain intervals may be read out.

The memory 330 stores, as needed, digital data output from the ADC circuit 310, data on which signal processing is performed by the signal processing unit 320, an arithmetic operation result obtained by the DSP 340, or the like.

Note that FIG. 4 illustrates, for an output signal from the ADC circuit 310, only a path input to the signal processing unit 320; however, the read-out circuit 301 may be configured such that an output signal from the ADC circuit 310 can be input to the memory 330. The memory 330 stores the algorithm of the learned model executed by the DSP 340 as a program and a coefficient.

The DSP 340 can reconstruct a learning model by using the training data and changing weights of various parameters in the learning model. The DSP 340 may have a plurality of learning models, which are ready for use, and can perform an arithmetic operation in which the learning model in use is changed in accordance with the content of arithmetic processing. Furthermore, the DSP 340 can acquire a learning model, which is a learned model, from an external apparatus and perform the processing above.

For example, the same learned model may be stored in the memory 330 included in one AI processing unit (for example, the AI processing unit 302) and the memory 330 included in another AI processing unit (for example, the AI processing unit 303). Even in this case, parallel processing can be performed by using a plurality of AI processing units. As a result, arithmetic operation speed can be increased. The AI processing units can be placed in a dispersed manner on the second substrate, and thus heat generation can occur in a dispersed manner, and local elevation of temperature due to generated heat can be reduced.

Alternatively, the learned model stored in the memory 330 of one of the AI processing units may be different from that stored in the memory 330 of another one of the AI processing units. In a case where outputs from the photoelectric conversion units provided with different color filters are to be processed, appropriate processes are different. In a case where the learned models stored in the memories 330 are changed on an AI processing unit basis, optimal processing can be performed for each color of the color filters.

The output unit 350 selectively outputs image data output from the DSPs 340 or data or arithmetic operation results stored in the memories 330 in accordance with, for example, a selection control signal from the controller. In a case where the DSPs 340 do not perform processing on data output from the signal processing unit 320 and where the output unit 350 outputs data output from the DSPs 340, the output unit 350 outputs image data output from the signal processing unit 320 as is.

As described above, the image data or arithmetic operation result output from the output unit 350 is input to an application processor (not illustrated) that performs display or processes a user interface or the like. The application processor includes, for example, a central processing unit (CPU), and executes an operating system, various types of application software, or the like.

Although not illustrated in FIG. 4, a composition processing unit that combines outputs from the respective AI processing units may be provided between the AI processing units 302 to 305 and the output unit 350. Alternatively, one of the AI processing units is configured to receive an output from another one of the AI processing units, and the one of the AI processing unit may have a composition processing function.

In the present embodiment, the case of the Bayer pattern has been described; however, the present embodiment is not limited to the Bayer pattern, and complementary color filters such as cyan (C), magenta (M), and yellow (Y) may be used. Furthermore, one of the two green color filters (Gr, Gb) may be replaced with a filter having different transmittance characteristics. For example, a filter arrangement including a white pixel provided with a filter having a high transmittance to almost the entire visible light region may be used. Alternatively, a filter arrangement including an IR pixel provided with a filter having a high transmittance to wavelengths corresponding to the infrared region may be used.

As described above, the plurality of AI processing units can perform processing corresponding to the types of filter in parallel. As a result, arithmetic operation speed can be increased. The AI processing units can be placed in a dispersed manner on the second substrate in a plan view. As a result, heat generation can occur in a dispersed manner, and local elevation of temperature due to generated heat can be reduced. Furthermore, characteristic processing corresponding to each filter can also be performed.

Second Embodiment

A second embodiment will be described using FIGS. 5A and 5B.

Figure 5A:
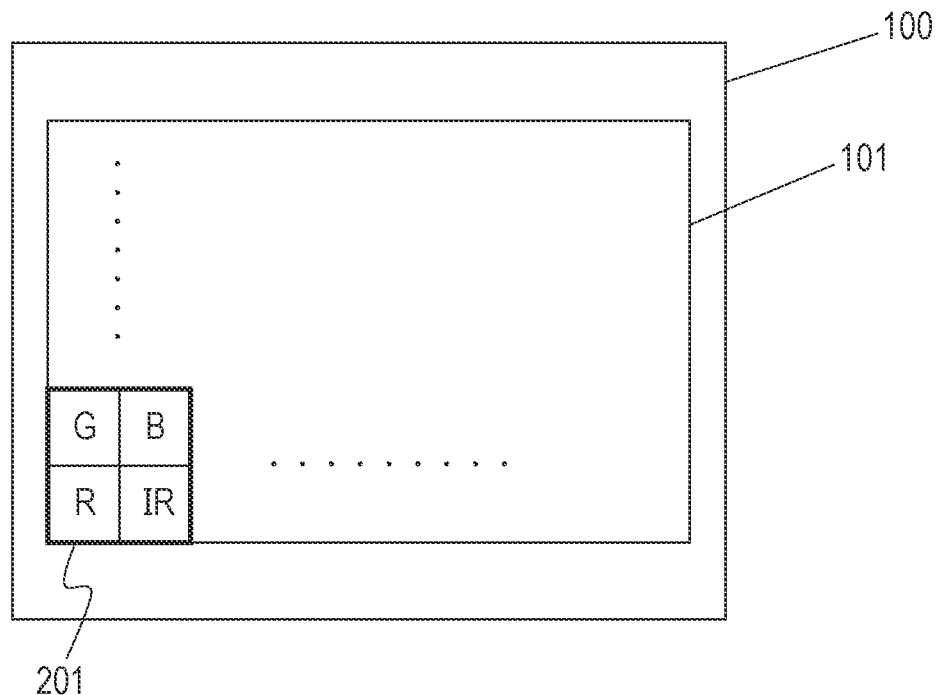
FIGS. 5A and 5B are plan views of a second substrate of a photoelectric conversion apparatus according to a second embodiment.

FIG. 5A is a plan view of a first substrate 100 of a photoelectric conversion apparatus according to the present embodiment. FIG. 5B is a plan view of a second substrate 102 of the photoelectric conversion apparatus.

In FIG. 5A, the first substrate 100 is provided with the photoelectric conversion region 101, and color filters 201 are provided above the photoelectric conversion units provided in the photoelectric conversion region 101. In FIG. 5A, a red color filter (R), a green color filter (G), a blue color filter (B), and an IR filter (IR) are illustrated. The IR filter is a filter provided to allow the photoelectric conversion unit to be sensitive to the infrared region. In this case, the IR filter is also treated as a color filter. Although not illustrated, the arrangement of these color filters forms one block, and blocks of these color filters are two-dimensionally arranged in the up-down and left-right directions.

Figure 5B:
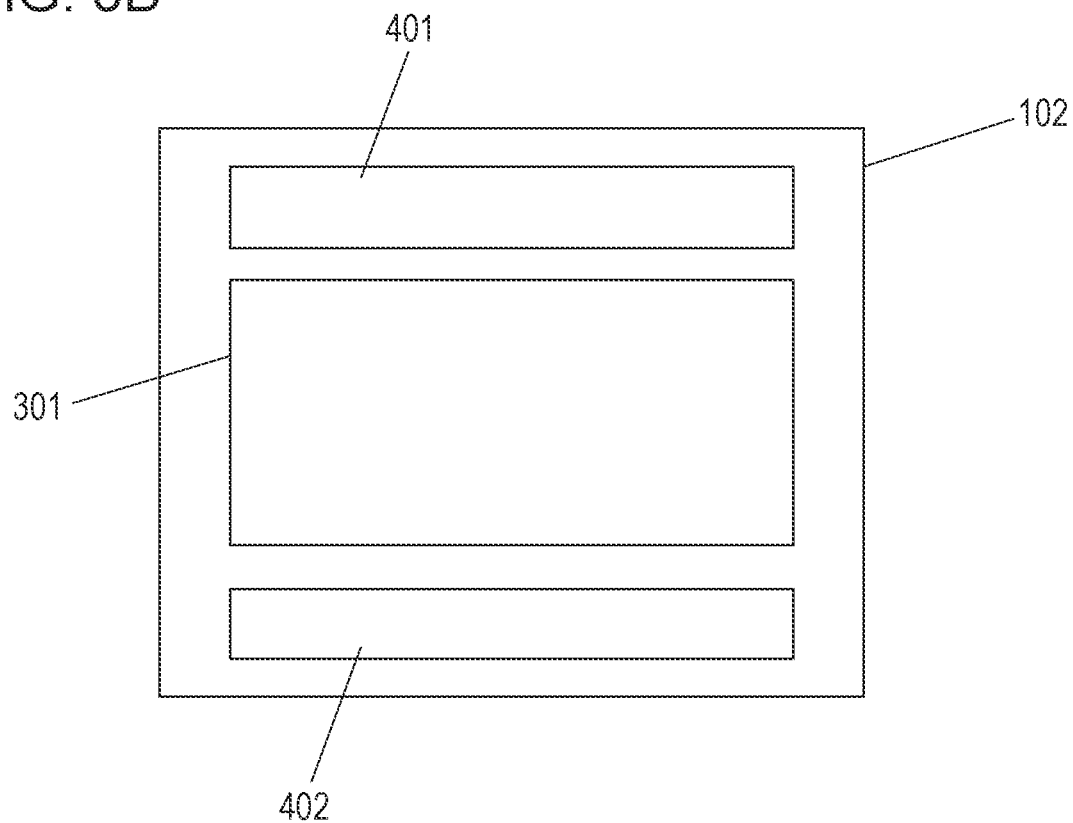

In FIG. 5B, a first AI processing unit 401 and a second AI processing unit 402 are arranged on the second substrate 102. In this case, the first AI processing unit 401 processes output signals from the photoelectric conversion units provided so as to correspond to the IR filters. The second AI processing unit 402 processes output signals from the photoelectric conversion units provided so as to correspond to the red, green, and blue color filters. That is, the first AI processing unit 401 is a processing unit that processes signals corresponding to the infrared region, and the second AI processing unit 402 is a processing unit that processes signals corresponding to the visible light region.

With the configuration as described above, it becomes possible to perform AI processing in parallel separately on an output signal corresponding to the visible light region and an output signal corresponding to the infrared region. As a result, AI processing speed can be increased.

An increase in temperature can be reduced due to dispersed heat transfer to the first substrate 100 through distributed processing and lower power consumption. Thus, a decrease in image quality or a decrease in the accuracy of an arithmetic operation result can be reduced.

Furthermore, it becomes possible to select a processing unit to be operated as needed, and power consumption can be reduced. For example, it is difficult to acquire, in darkness, a detection signal in the visible light region, and thus it is conceivable that only signals from pixels for the infrared region will be processed. In this case, control is performed under which only the first AI processing unit 401 is operated (an operation mode), and the second AI processing unit 402 is not operated (a non-operation mode). Under control like this, lower power consumption can be achieved. Not only in a case where image capturing is to be performed but also in a case where autofocus processing for an imaging plane is to be performed, the control is also possible under which the first AI processing unit 401 is operated and the second AI processing unit 402 is not operated. Furthermore, in contrast, in a case where detection of light in the infrared region is unnecessary, control is possible under which the first AI processing unit 401 is not operated and the second AI processing unit 402 is operated. Note that the non-operation mode described above includes not only a case where the AI processing unit that does not have to perform processing is completely stopped but also a case where the AI processing unit is put on standby.

In addition, there may be a case where luminance information is acquired from pixels for the infrared region, and color information is acquired from pixels for the visible light region, and where processing for combining the luminance information with the color information is performed. For example, in a case where image capturing is performed using light in the visible light region to capture an image of a landscape, there may be a case where a clear image cannot be formed due to a fog. To cope with this issue, luminance information is acquired from the infrared region, which is less affected by a fog, to form an image. In this case, the first AI processing unit 401 processes a signal as luminance information, whereas the second AI processing unit 402 processes a signal as color information. Thus, optimal processing for luminance information differs from that for color information. Thus, the learned model stored in a memory of the first AI processing unit 401 differs from that stored in a memory of the second AI processing unit 402. With this configuration, not only can parallel processing be performed, but also it becomes possible to perform optimized processing on output signals from the pixels for infrared light and optimized processing on output signals from the pixels for visible light.

Third Embodiment

A third embodiment will be described using FIG. 6.

Figure 6:
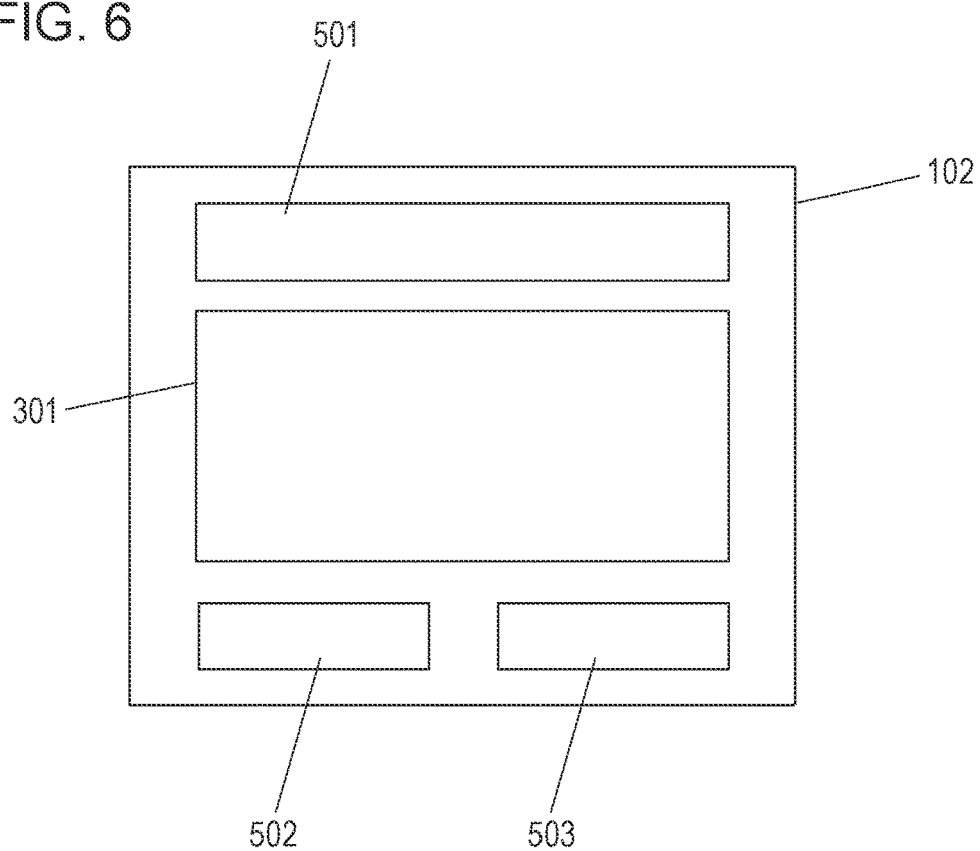
FIG. 6 is a plan view of a second substrate of a photoelectric conversion apparatus according to a third embodiment.

FIG. 6 is a plan view of a second substrate 102 of a photoelectric conversion apparatus according to the present embodiment. The color filter arrangement illustrated in FIG. 2 is used in the present embodiment.

In FIG. 6, a first AI processing unit 501, a second AI processing unit 502, and a third AI processing unit 503 are arranged on the second substrate 102. In this case, the first AI processing unit 501 processes output signals from the photoelectric conversion units provided so as to correspond to the green color filters (Gr, Gb) in the Bayer pattern color filter for the photoelectric conversion units. The second AI processing unit 502 processes output signals from the photoelectric conversion units provided so as to correspond to the red color filters (R). Furthermore, the third AI processing unit 503 processes output signals from the photoelectric conversion units provided so as to correspond to the blue color filters (B).

For example, there may be a case where luminance information is acquired from the pixels provided with the green color filters, and color information is acquired from the pixels provided with the other color filters and where processing for combining the luminance information with the color information is performed. Since the human eye has a high sensitivity to the wavelength region corresponding to green, output signals from the photoelectric conversion units provided with the green color filters are used as luminance information. In contrast, output signals from the photoelectric conversion units provided with the other color filters are used as color information. In this case, the first AI processing unit 501 processes a signal as luminance information, whereas the second AI processing unit 502 and the third AI processing unit 503 process a signal as color information. Thus, optimal processing for luminance information differs from that for color information. Thus, the learned model stored in a memory of the first AI processing unit 501 differs from that stored in a memory of the second AI processing unit 502 and that stored in a memory of the third AI processing unit 503. Moreover, regarding output signals from the pixels provided with the red color filters and output signals from the pixels provided with the blue color filters, a final image output result varies depending on the way in which these signals are combined. Thus, optimal processing for red differs from that for blue. Thus, the learned model stored in the memory of the second AI processing unit 502 may differ from that stored in the memory of the third AI processing unit 503.

With the configuration described above, it becomes possible to perform AI processing in parallel on output signals corresponding to the respective color filters. As a result, AI processing speed can be increased.

An increase in temperature can be reduced due to dispersed heat transfer to the first substrate 100 through distributed processing and lower power consumption. Thus, a decrease in image quality or a decrease in the accuracy of an arithmetic operation result can be reduced.

Furthermore, with the above-described configuration, not only can parallel processing be performed, but also it becomes possible for the AI processing units to perform, on output signals from the pixels provided with different color filters, processing optimized for each color filter. As a result, since optimized processing is performed by each AI processing unit, lower power consumption can be achieved than in the case where processing that is not optimized is performed by each AI processing unit.

In addition, in a case where only luminance information is needed, it is possible to perform control such that the second AI processing unit 502 and the third AI processing unit 503 are not operated. As a result, lower power consumption can be achieved. For example, in a case where imaging plane autofocusing is performed, autofocus (AF) tracking or motion prediction based on photographic subject recognition is performed through signal processing performed by the AI processing unit using only luminance information. In contrast, the AI processing units are not operated that perform processing on signals used to acquire color information. As a result, lower power consumption can be achieved. An increase in temperature can be reduced, and a decrease in image quality or in the accuracy of an arithmetic operation result can be reduced.

In the present embodiment, the case where the color filter has a Bayer pattern has been described; however, a filter pattern using complementary color filters or a filter pattern including a white pixel may also be used. As described in the second embodiment, the filter pattern including "R", "G", "B", and "IR" may also be used. In this case, in 2×2 pixels, the types of filters of the four pixels are different from each other. The photoelectric conversion apparatus may thus be configured such that parallel processing or distributed processing can be performed using first to fourth AI processing units. In this case, the learned models stored in memories of the respective first to fourth AI processing units may differ from each other.

Fourth Embodiment

A fourth embodiment will be described using FIGS. 7 and 8.

Figure 7:
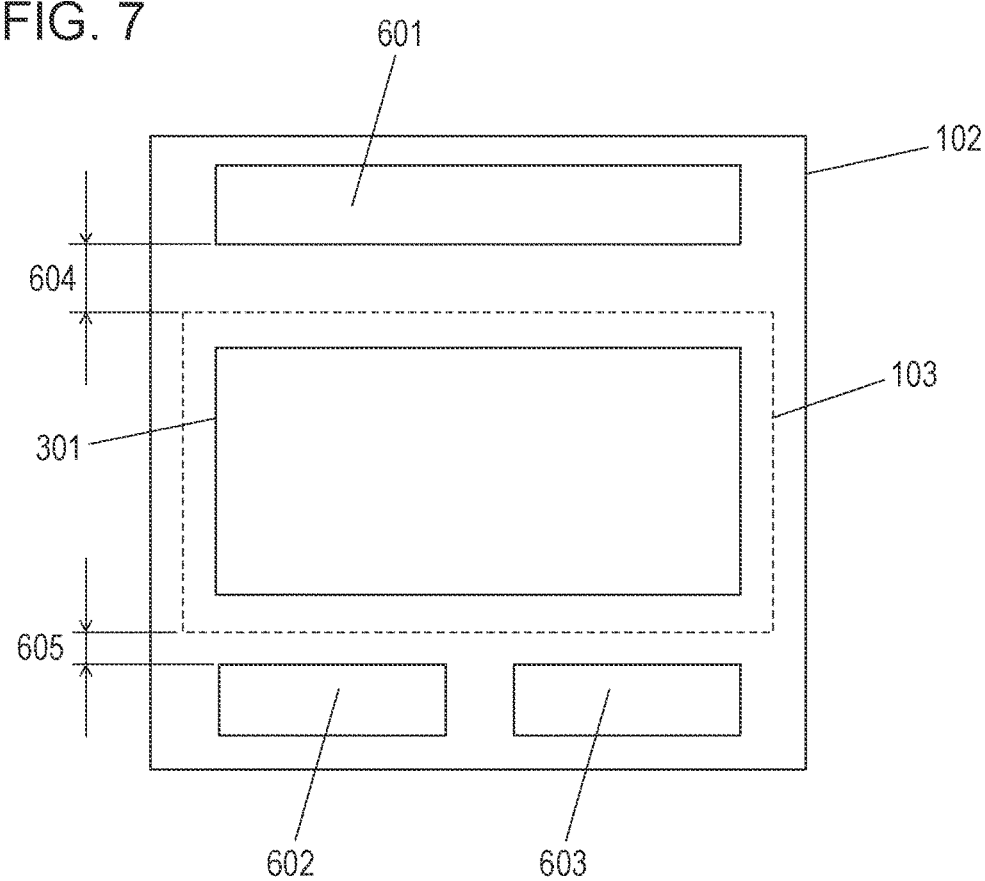
FIG. 7 is a plan view of a second substrate of a photoelectric conversion apparatus according to a fourth embodiment.

FIG. 7 is a plan view of a second substrate 102 of a photoelectric conversion apparatus according to the present embodiment. The color filter arrangement illustrated in FIG. 2 is used in the present embodiment. Indeed, not only the Bayer pattern illustrated in FIG. 2 but also a filter pattern using complementary color filters or a filter pattern including a white pixel or an infrared pixel may also be used.

A first AI processing unit 601, a second AI processing unit 602, and a third AI processing unit 603 are arranged on the second substrate 102. In this case, the first AI processing unit 601 processes output signals from the photoelectric conversion units provided so as to correspond to the green color filters (Gr, Gb).

The second AI processing unit 602 processes output signals from the photoelectric conversion units provided so as to correspond to the red color filters (R). The third AI processing unit 603 processes output signals from the photoelectric conversion units provided so as to correspond to the blue color filters (B).

In FIG. 7, a region 103 surrounded by a dotted line is a region that overlaps the photoelectric conversion region 101 in a plan view. In this case, in a first direction, the distance between the first AI processing unit 601 and the boundary of the region 103 is illustrated as a distance 604. Similarly, in the first direction, the distance between the second AI processing unit 602 and the boundary of the region 103 is illustrated as a distance 605. Note that the second AI processing unit 602 and the third AI processing unit 603 are arranged so as to be adjoined in a second direction orthogonal to the first direction. Thus, in the first direction, the distance between the third AI processing unit 603 and the boundary of the region 103 is also the distance 605.

In this case, in FIG. 7, the relationship between the distances 604 and 605 is the distance 604>the distance 605. That is, the first AI processing unit 601 is placed so as to be farther from the boundary of the region 103 than the second AI processing unit 602 and the third AI processing unit 603 are.

As described in the third embodiment, there may be a case where output signals from the photoelectric conversion units provided with the green color filters are used as luminance information, and output signals from the photoelectric conversion units provided with the red and blue color filters are used as color information. In this case, processing performed by the AI processing units such as object recognition, counting of the number of objects, or image processing is often based on processing using luminance information. Moreover, in a case where imaging plane autofocusing is performed, the imaging plane autofocusing is based on processing using luminance information. Thus, the processing load of the first AI processing unit 601, which processes output signals from the photoelectric conversion units provided with the green color filters, is heavier than those of the other AI processing units.

This is why the configuration illustrated in FIG. 7 is used to place the AI processing unit that processes luminance information and has a heavy AI processing load so as to be farther from the photoelectric conversion region than the AI processing units are that process color information and have light AI processing loads. The AI processing unit that processes luminance information and has a heavy AI processing load is, for example, the first AI processing unit 601. The AI processing units that process color information and have light AI processing loads are, for example, the second AI processing unit 602 and the third AI processing unit 603. As a result, it becomes possible to reduce the effect of generated heat and noise from the AI processing unit having a heavy AI processing load on the photoelectric conversion region.

Figure 8:
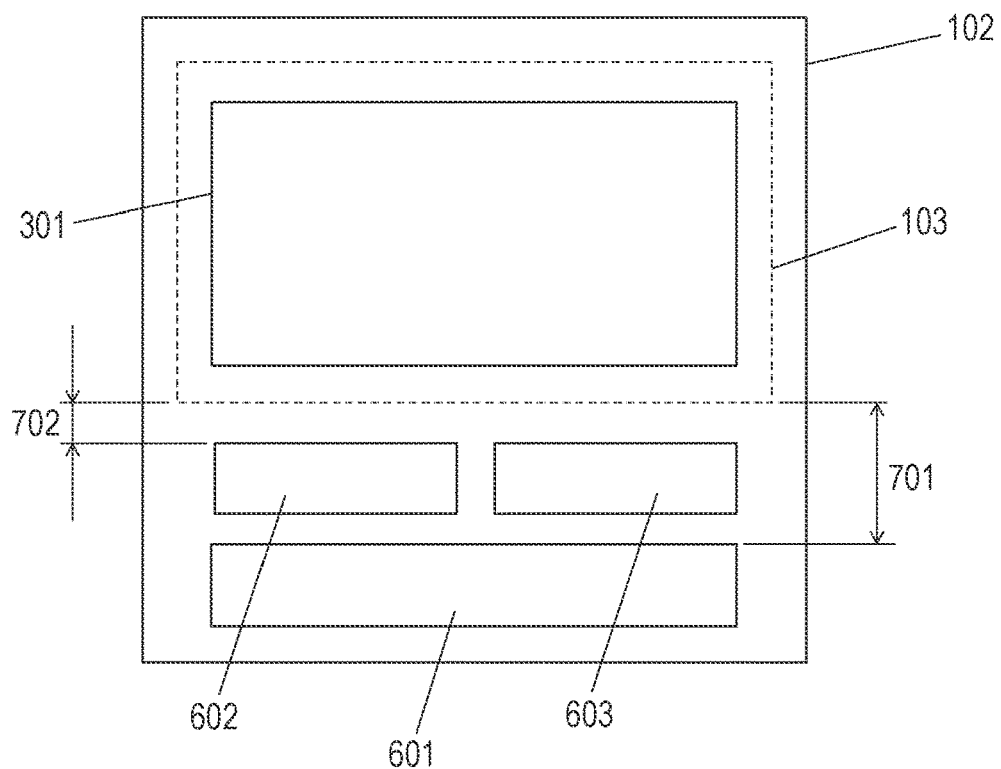
FIG. 8 is a plan view of a second substrate of a photoelectric conversion apparatus according to a fourth embodiment.

FIG. 8 illustrates a modified arrangement of the AI processing units of FIG. 7. A distance 701 is the distance between the first AI processing unit 601 and the boundary of the region 103 in the first direction. A distance 702 is the distance between the second AI processing unit 602 and the boundary of the region 103 in the first direction. Note that the second AI processing unit 602 and the third AI processing unit 603 are arranged so as to be adjoined in the second direction. Thus, the distance between the third AI processing unit 603 and the boundary of the region 103 is also the distance 702.

In this case, in FIG. 8, the relationship between the distances 701 and 702 is the distance 701>the distance 702. That is, the first AI processing unit 601 is placed so as to be farther from the boundary of the region 103 than the second AI processing unit 602 and the third AI processing unit 603 are.

Similarly to as in FIG. 7, by using the configuration illustrated in FIG. 8, the AI processing unit that processes luminance information and has a heavy AI processing load can be placed so as to be farther from the photoelectric conversion region than the AI processing units are that process color information and have light AI processing loads. As a result, it becomes possible to reduce the effect of generated heat and noise from the AI processing unit having a heavy AI processing load on the photoelectric conversion region.

FIGS. 7 and 8 illustrate examples in which, when viewed in a plan view, the region 103 overlapping the photoelectric conversion region 101 does not overlap each AI processing unit. Note that there may be a case where, when viewed in a plan view, the AI processing unit that processes luminance information and has a heavy processing load (for example: the first AI processing unit) and the AI processing units that process color information and have light AI processing loads (for example: the second and third AI processing units) overlap the region 103. In this case, the overlapping region of the region 103 and the AI processing unit that processes luminance information and has a heavy processing load (for example: the first AI processing unit) is referred to as a first overlapping region. The overlapping region of the region 103 and the AI processing units that process color information and have light AI processing loads (for example: the second and third AI processing units) is referred to as a second overlapping region. In this case, by making the first overlapping region smaller the second overlapping region, it becomes possible to reduce the effect of generated heat and noise from the AI processing unit having a heavy AI processing load on the photoelectric conversion region.

Fifth Embodiment

A fifth embodiment will be described using FIGS. 9 and 10.

Figure 9:
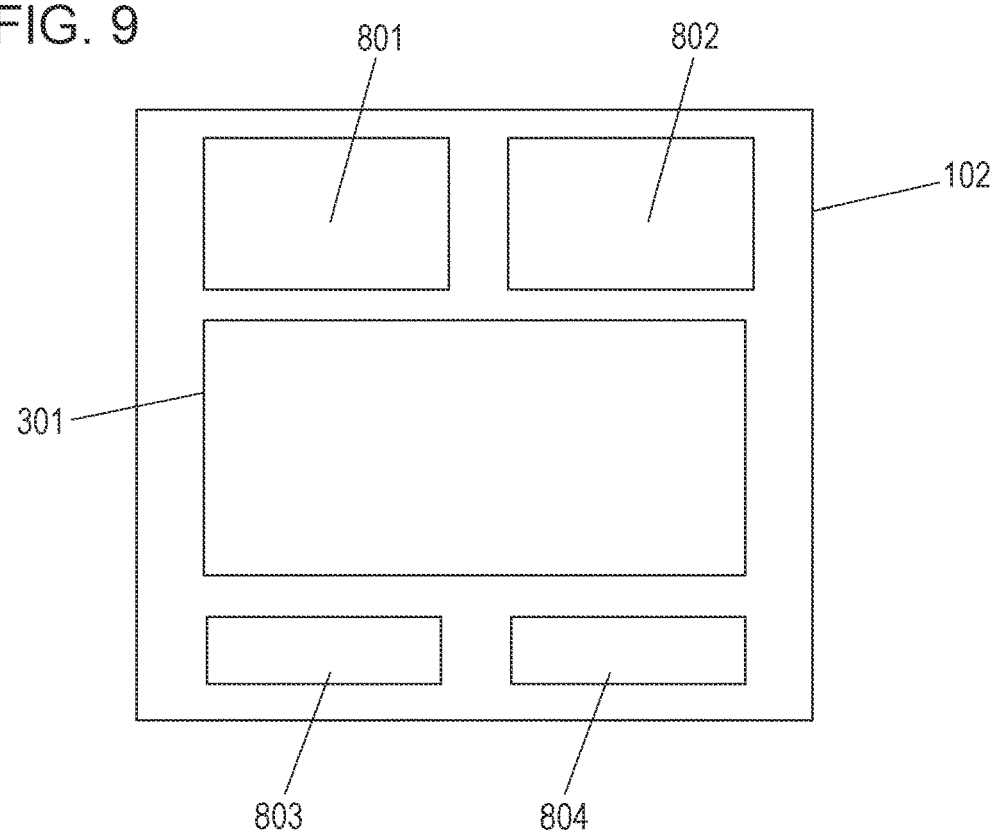
FIG. 9 is a plan view of a second substrate of a photoelectric conversion apparatus according to a fifth embodiment.

FIG. 9 is a plan view of a second substrate 102 of a photoelectric conversion apparatus according to the present embodiment. The color filter arrangement illustrated in FIG. 2 is used in the present embodiment. Indeed, not only the Bayer pattern illustrated in FIG. 2 but also a filter pattern using complementary color filters or a filter pattern including a white pixel or an infrared pixel may also be used.

A first AI processing unit 801, a second AI processing unit 802, a third AI processing unit 803, and a fourth AI processing unit 804 are arranged on the second substrate 102. In this case, each of the first AI processing unit 801 and the second AI processing unit 802 processes output signals from the photoelectric conversion units provided so as to correspond to the green color filters (Gr, Gb). The third AI processing unit 803 processes output signals from the photoelectric conversion units provided so as to correspond to the red color filters (R). The fourth AI processing unit 804 processes output signals from the photoelectric conversion units provided so as to correspond to the blue color filters (B).

In FIG. 9, on the second substrate 102, the areas occupied by the first AI processing unit 801 and the second AI processing unit 802 are larger than the areas occupied by the third AI processing unit 803 and the fourth AI processing unit 804. In this case, it is assumed that output signals from the photoelectric conversion units provided with the green color filters (Gr, Gb) are used as luminance information, and output signals from the photoelectric conversion units provided with the other color filters are used as color information. In this case, processing performed by the AI processing units such as object recognition, counting of the number of objects, or image processing is often based on processing using luminance information. Moreover, in a case where imaging plane autofocusing is performed, the imaging plane autofocusing is based on processing using luminance information. Thus, the processing loads of the first AI processing unit 801 and the second AI processing unit 802, which process output signals from the photoelectric conversion units provided with the green color filters, are heavier than those of the other AI processing units.

This is why the areas occupied by the AI processing units that process luminance information and have heavy processing loads (for example: the first and second AI processing units) are made larger than those occupied by the AI processing units that process color information and have light AI processing loads (for example: the third and fourth AI processing units). As a result, the processing power of the former AI processing units can be increased, and the speed of AI processing performed by the entire photoelectric conversion apparatus can be increased.

Figure 10:
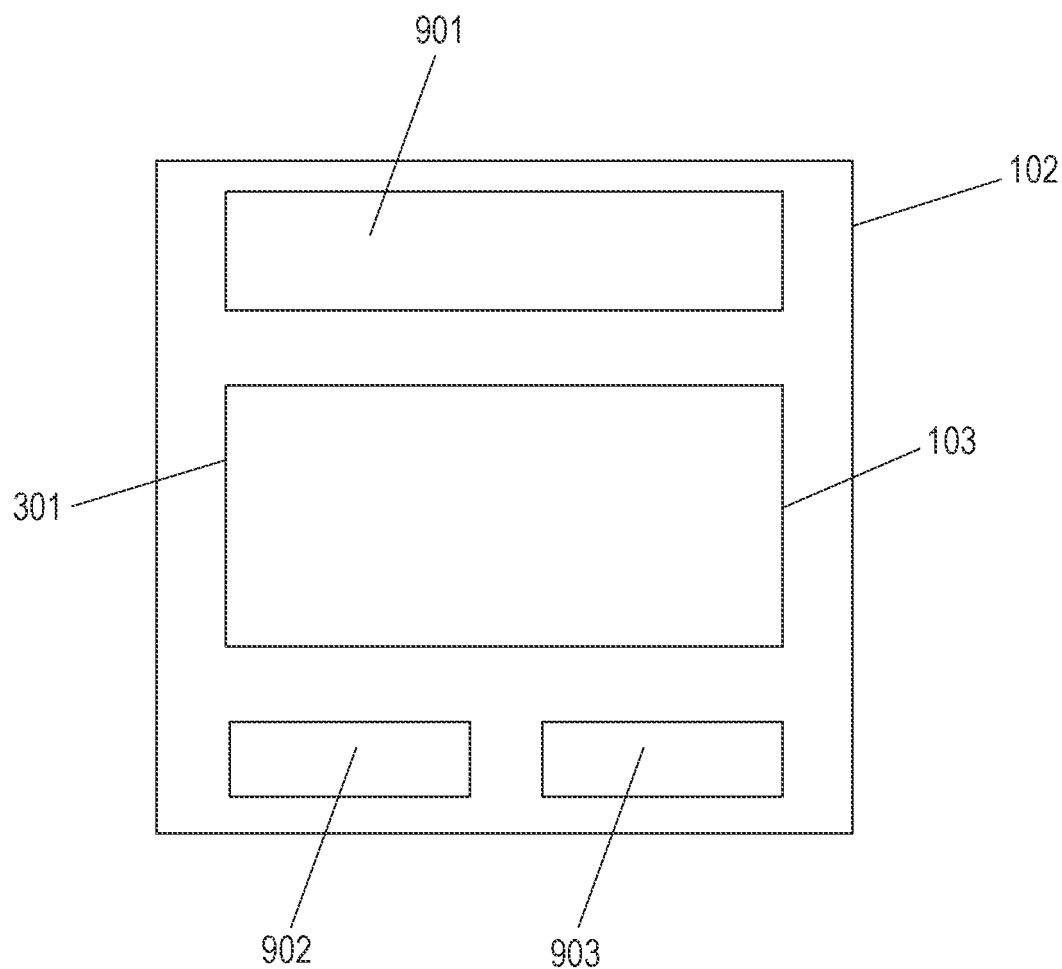
FIG. 10 is a plan view of a second substrate of a photoelectric conversion apparatus according to the fifth embodiment.

FIG. 10 illustrates a first AI processing unit 901 serving as the first AI processing unit 801 and the second AI processing unit 802 in FIG. 9. That is, the first AI processing unit 901 processes output signals from the photoelectric conversion units provided so as to correspond to the green color filters (Gr, Gb). A second AI processing unit 902 processes output signals from the photoelectric conversion units provided so as to correspond to the red color filters (R). A third AI processing unit 903 processes output signals from the photoelectric conversion units provided so as to correspond to the blue color filters (B).

In FIG. 10, the area occupied by the first AI processing unit 901 is larger than that occupied by the second AI processing unit 902. Moreover, the area occupied by the first AI processing unit 901 is larger than that occupied by the third AI processing unit 903. Furthermore, the area occupied by the first AI processing unit 901 is larger than the sum of the area occupied by the second AI processing unit 902 and that occupied by the third AI processing unit 903.

With this configuration, the processing power of the first AI processing unit 901, which processes output signals from the photoelectric conversion units provided with the green color filters, can be increased, and the speed of AI processing performed by the entire photoelectric conversion apparatus can be increased.

Sixth Embodiment

Figure 11:
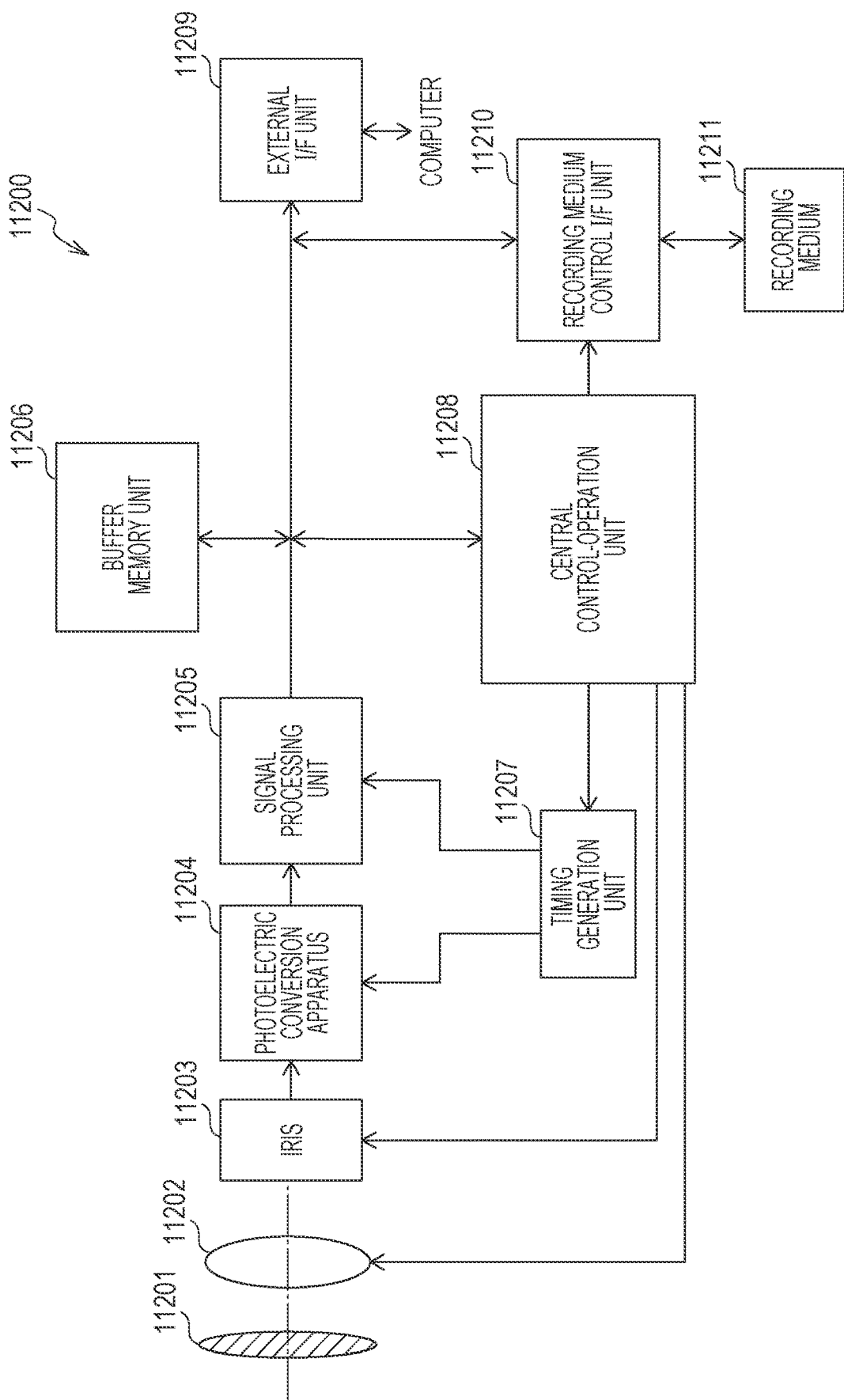
FIG. 11 is a functional block diagram of a photoelectric conversion system according to a sixth embodiment.

FIG. 11 is a block diagram illustrating the configuration of a photoelectric conversion system 11200 according to the present embodiment. The photoelectric conversion system 11200 according to the present embodiment includes a photoelectric conversion apparatus 11204. In this case, any one of the photoelectric conversion apparatuses described in the above-described embodiments can be used as the photoelectric conversion apparatus 11204. The photoelectric conversion system 11200 can be used as, for example, an image capturing system. Specific examples of the image capturing system include digital still cameras, digital camcorders, surveillance cameras, and network cameras. FIG. 11 illustrates an example of a digital still camera as the photoelectric conversion system 11200.

The photoelectric conversion system 11200 illustrated in FIG. 11 includes the photoelectric conversion apparatus 11204 and a lens 11202 for causing the photoelectric conversion apparatus 11204 to form an optical image of a subject. The photoelectric conversion system 11200 includes an iris 11203 for changing the amount of light passing through the lens 11202 and a barrier 11201 for protecting the lens 11202. The lens 11202 and the iris 11203 are an optical system for concentrating light onto the photoelectric conversion apparatus 11204.

The photoelectric conversion system 11200 includes a signal processing unit 11205, which processes an output signal output from the photoelectric conversion apparatus 11204. The signal processing unit 11205 performs a signal processing operation in which various types of correction or compression are performed on an input signal as needed. The photoelectric conversion system 11200 further includes a buffer memory unit 11206 for temporarily storing image data and an external interface (I/F) unit 11209 for communicating with an external computer or the like. Furthermore, the photoelectric conversion system 11200 includes a recording medium 11211 such as a semiconductor memory for recording or reading out captured image data and a recording medium control I/F unit 11210 for recording data in or reading out data from the recording medium 11211. The recording medium 11211 may be built in or detachable from the photoelectric conversion system 11200. The recording medium control I/F unit 11210 may wirelessly communicate with the recording medium 11211 and with the external interface I/F unit 11209.

Furthermore, the photoelectric conversion system 11200 includes a central control-operation unit 11208, which performs various types of arithmetic operations and also controls the entire digital still camera, and a timing generation unit 11207, which outputs various types of timing signals to the photoelectric conversion apparatus 11204 and the signal processing unit 11205. In this case, a timing signal and the like may be input from the outside. It is sufficient that the photoelectric conversion system 11200 include at least the photoelectric conversion apparatus 11204 and the signal processing unit 11205, which processes an output signal output from the photoelectric conversion apparatus 11204. The central control-operation unit 11208 and the timing generation unit 11207 may be configured to execute some or all of the control functions of the photoelectric conversion apparatus 11204.

The photoelectric conversion apparatus 11204 outputs a signal for an image to the signal processing unit 11205. The signal processing unit 11205 performs certain signal processing on the signal output from the photoelectric conversion apparatus 11204 to output image data. The signal processing unit 11205 also generates the image using the signal output from the photoelectric conversion apparatus 11204. The signal processing unit 11205 may also perform a distance-measurement arithmetic operation on the signal output from the photoelectric conversion apparatus 11204. Note that the signal processing unit 11205 or the timing generation unit 11207 may be built in the photoelectric conversion apparatus 11204. That is, the signal processing unit 11205 or the timing generation unit 11207 may be provided on a substrate where pixels are arranged or may be provided on another substrate. An image capturing system that can acquire higher quality images can be realized by forming the configuration of the image capturing system using a photoelectric conversion apparatus according to any one of the embodiments described above.

Seventh Embodiment

Figure 12:
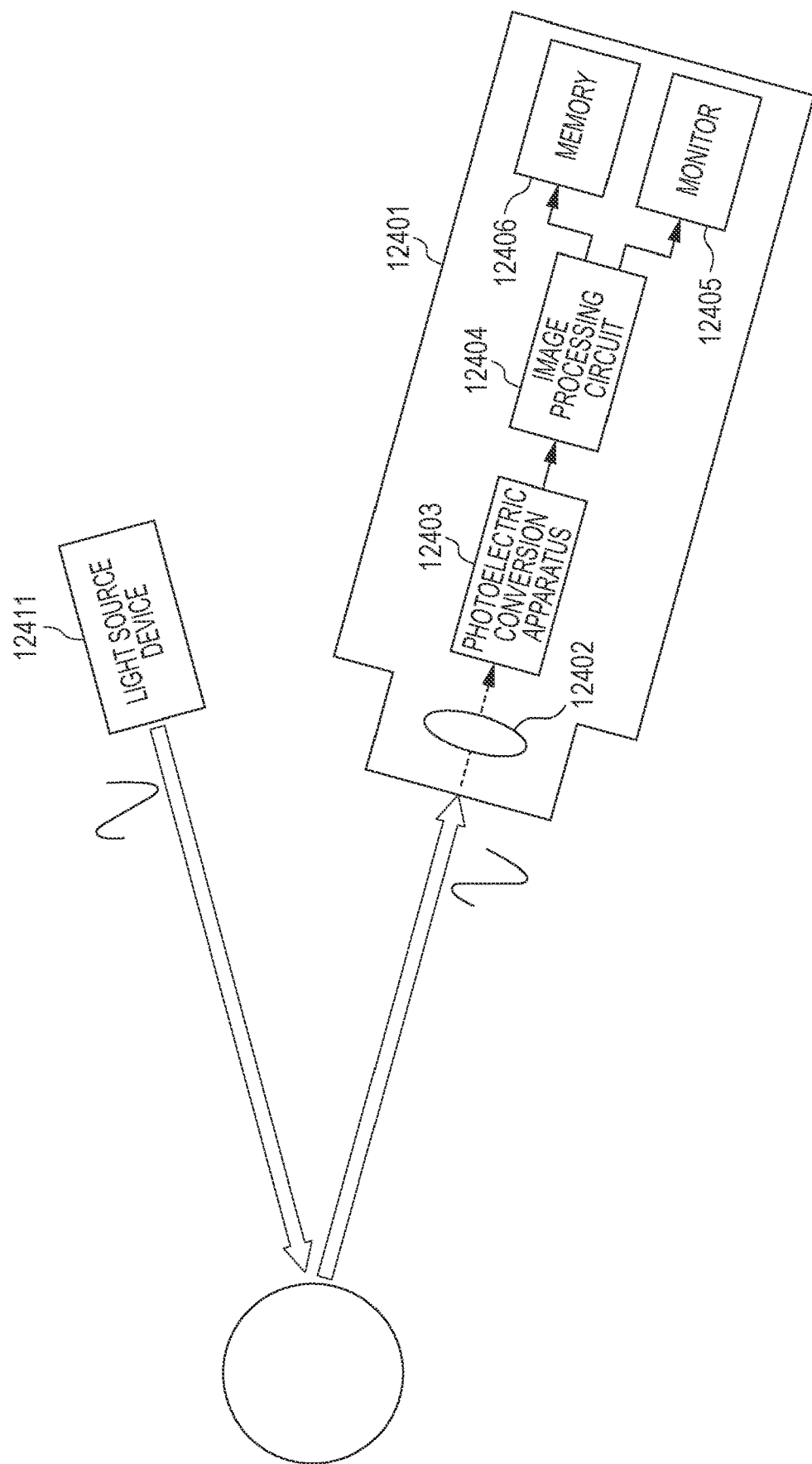
FIG. 12 is a functional block diagram of a distance sensor according to a seventh embodiment.

FIG. 12 is a block diagram illustrating an example of the configuration of a distance image sensor, which is an electronic device using any one of the photoelectric conversion apparatuses described in the above-described embodiments.

As illustrated in FIG. 12, a distance image sensor 12401 includes an optical system 12402, a photoelectric conversion apparatus 12403, an image processing circuit 12404, a monitor 12405, and a memory 12406. The distance image sensor 12401 receives light emitted from a light source device 12411 to a subject and reflected by the surface of the subject (modulated light or pulsed light) and consequently can acquire a distance image corresponding to the distance to the subject.

The optical system 12402 includes one or more lenses. The optical system 12402 guides image light (incident light) from the subject to the photoelectric conversion apparatus 12403, and causes an image to be formed on a photosensitive surface (a sensor unit) of the photoelectric conversion apparatus 12403.

As the photoelectric conversion apparatus 12403, any one of the photoelectric conversion apparatuses according to the above-described embodiments is used. A distance signal representing a distance obtained from a light reception signal and output from the photoelectric conversion apparatus 12403 is supplied to the image processing circuit 12404.

The image processing circuit 12404 performs image processing in which a distance image is constructed on the basis of the distance signal supplied from the photoelectric conversion apparatus 12403. The distance image (image data) obtained as a result of the image processing is supplied to and displayed on the monitor 12405 or is supplied to and stored (recorded) in the memory 12406.

In the distance image sensor 12401 configured in this manner, the characteristics of pixels are improved by using one of the photoelectric conversion apparatuses described above and consequently, for example, a more accurate distance image can be acquired.

Eighth Embodiment

The technology according to the present disclosure (the present technology) can be applied to various products. For example, the technology according to the present disclosure may be applied to an endoscopic operation system.

Figure 13:
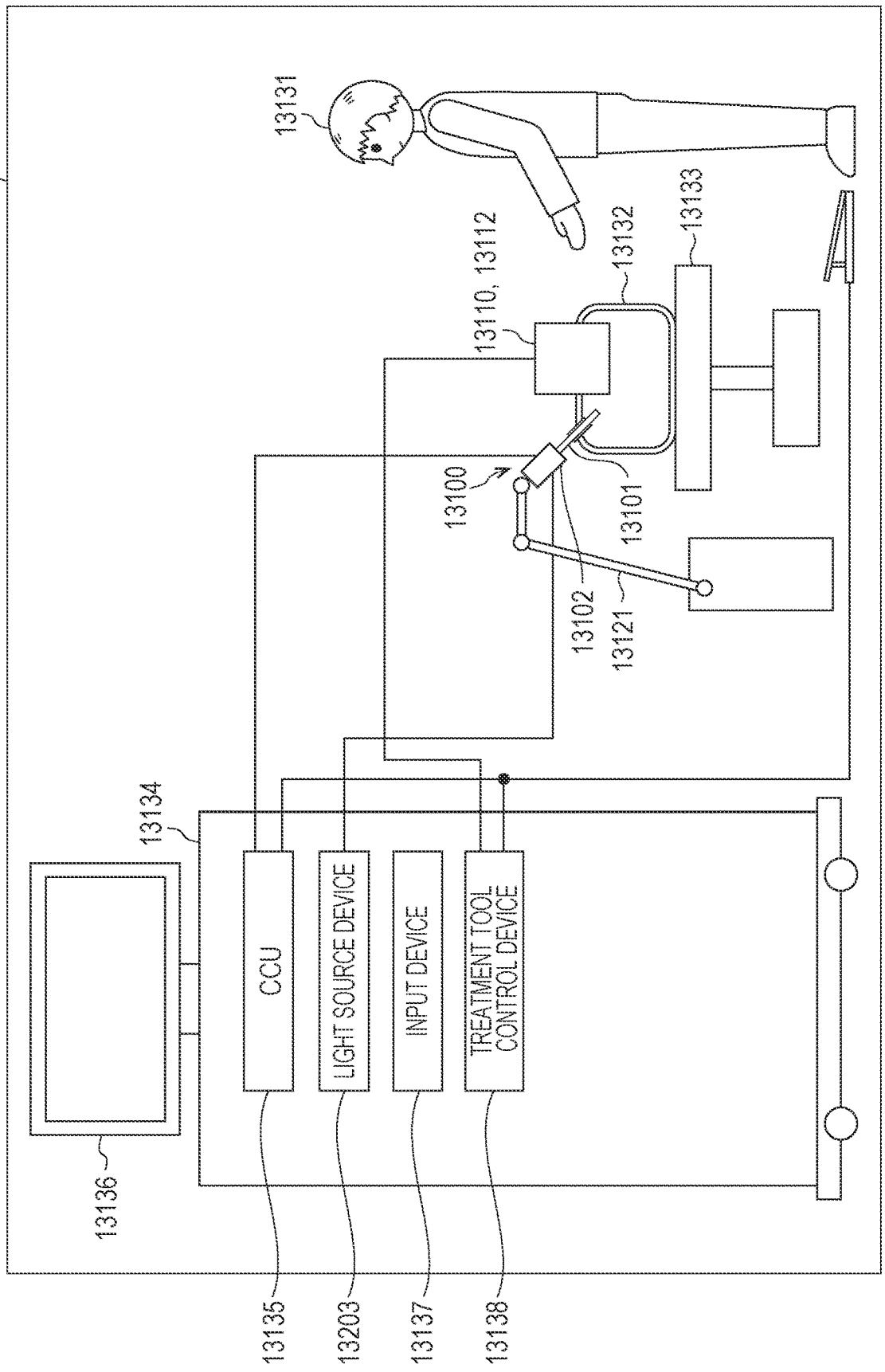
FIG. 13 is a functional block diagram of an endoscopic operation system according to an eighth embodiment.

FIG. 13 is a diagram illustrating an example of a schematic configuration of an endoscopic operation system to which the technology according to the present disclosure (the present technology) can be applied.

FIG. 13 illustrates a situation in which a practitioner (a doctor) 13131 is performing a surgical operation on a patient 13132 on a patient bed 13133 by using an endoscopic operation system 13003. As illustrated in FIG. 13, the endoscopic operation system 13003 includes an endoscope 13100, a surgical tool 13110, and a cart 13134, on which various types of devices for endoscopic operations are mounted.

The endoscope 13100 includes a lens tube 13101 and a camera head 13102. A portion of the lens tube 13101 starting from its leading edge and having a predetermined length is inserted into a body cavity of the patient 13132. The camera head 13102 is connected to a base end of the lens tube 13101. In the illustrated example, the endoscope 13100 is formed as a rigid scope including the lens tube 13101, which is rigid; however, the endoscope 13100 may be formed as a so-called flexible scope having a flexible lens tube.

The leading edge of the lens tube 13101 is provided with an opening in which an objective lens is embedded. The endoscope 13100 is connected to a light source device 13203. Light generated by the light source device 13203 is guided to the leading edge of the lens tube 13101 along a light guide extended in the lens tube 13101. This light is emitted toward an observation target in the body cavity of the patient 13132 through the objective lens. Note that the endoscope 13100 may be a direct-viewing endoscope, an oblique-viewing endoscope, or a side-viewing endoscope.

The camera head 13102 includes an optical system and a photoelectric conversion apparatus. Reflected light (observation light) from the observation target is concentrated by the optical system onto the photoelectric conversion apparatus. The observation light is photoelectrically converted by the photoelectric conversion apparatus, and an electric signal corresponding to the observation light, that is, an image signal corresponding to an observation image is generated. As the photoelectric conversion apparatus, any one of the photoelectric conversion apparatuses described in the above-described embodiments can be used. The image signal is transmitted as RAW data to a camera control unit (CCU) 13135.

The CCU 13135 includes, for example, a central processing unit (CPU) and a graphics processing unit (GPU), and performs central control on operations of the endoscope 13100 and a display device 13136. Furthermore, the CCU 13135 receives an image signal from the camera head 13102, and performs, on the image signal, various types of image processing for displaying an image based on the image signal such as development processing (demosaicing) or the like.

The display device 13136 displays, under control performed by the CCU 13135, the image based on the image signal on which image processing is performed by the CCU 13135.

The light source device 13203 includes, for example, a light source such as a light-emitting diode (LED) and supplies, to the endoscope 13100, illumination light to be used when an image of a surgical target or the like is captured.

An input device 13137 is an input interface for the endoscopic operation system 13003. The user can input various types of information or commands to the endoscopic operation system 13003 through the input device 13137.

A treatment tool control device 13138 controls driving of an energy treatment tool 13112 for ablating or dissecting tissue, closing a blood vessel, or the like.

The light source device 13203 supplies, to the endoscope 13100, illumination light to be used when an image of a surgical target is captured. The light source device 13203 includes a white light source formed by, for example, an LED, a laser light source, or a combination of an LED and a laser light source. In a case where the white light source is formed by a combination of RGB laser light sources, the output intensity and the output timing of each color (each wavelength) can be controlled with high accuracy, and thus the white balance of a captured image can be adjusted by the light source device 13203. Moreover, in this case, an observation target is irradiated with laser light from each of the RGB laser light sources in a time division manner, and driving of an image sensor of the camera head 13102 is controlled in synchronization with the irradiation timing. As a result, images corresponding to R, G, and B in a respective manner can be captured in a time division manner With the method, the image sensor can capture color images without being provided with color filters.

Driving of the light source device 13203 may be controlled such that the intensity of output light is changed every certain time period. Images are acquired in a time division manner by controlling driving of the image sensor of the camera head 13102 in synchronization with the timing at which the intensity of the light is changed, and the images are combined. As a result, high dynamic range images without so-called crushed shadows and blown highlights can be generated.

The light source device 13203 may also be configured to be able to supply light having a predetermined wavelength band corresponding to special light observation. In special light observation, for example, the wavelength dependence of light absorption in body tissue is used. Specifically, by performing irradiation with light of a narrower band than the illumination light used at the time of a normal observation (that is, white light), images of certain tissue such as a blood vessel in a mucosal surface layer can be captured with high contrast. Alternatively, in special light observation, fluorescence observation may be performed in which an image is obtained using fluorescence generated by excitation light irradiation. In fluorescence observation, for example, body tissue is irradiated with excitation light, and fluorescence from the body tissue can be observed. Alternatively, in fluorescence observation, a reagent such as indocyanine green (ICG) is locally injected to body tissue, and the body tissue is irradiated with excitation light corresponding to the fluorescence wavelength of the reagent, so that a fluorescence image can be obtained. The light source device 13203 may be configured to be able to supply at least one out of light of a narrow band and excitation light that correspond to such special light observation.

Ninth Embodiment

Figure 14A:
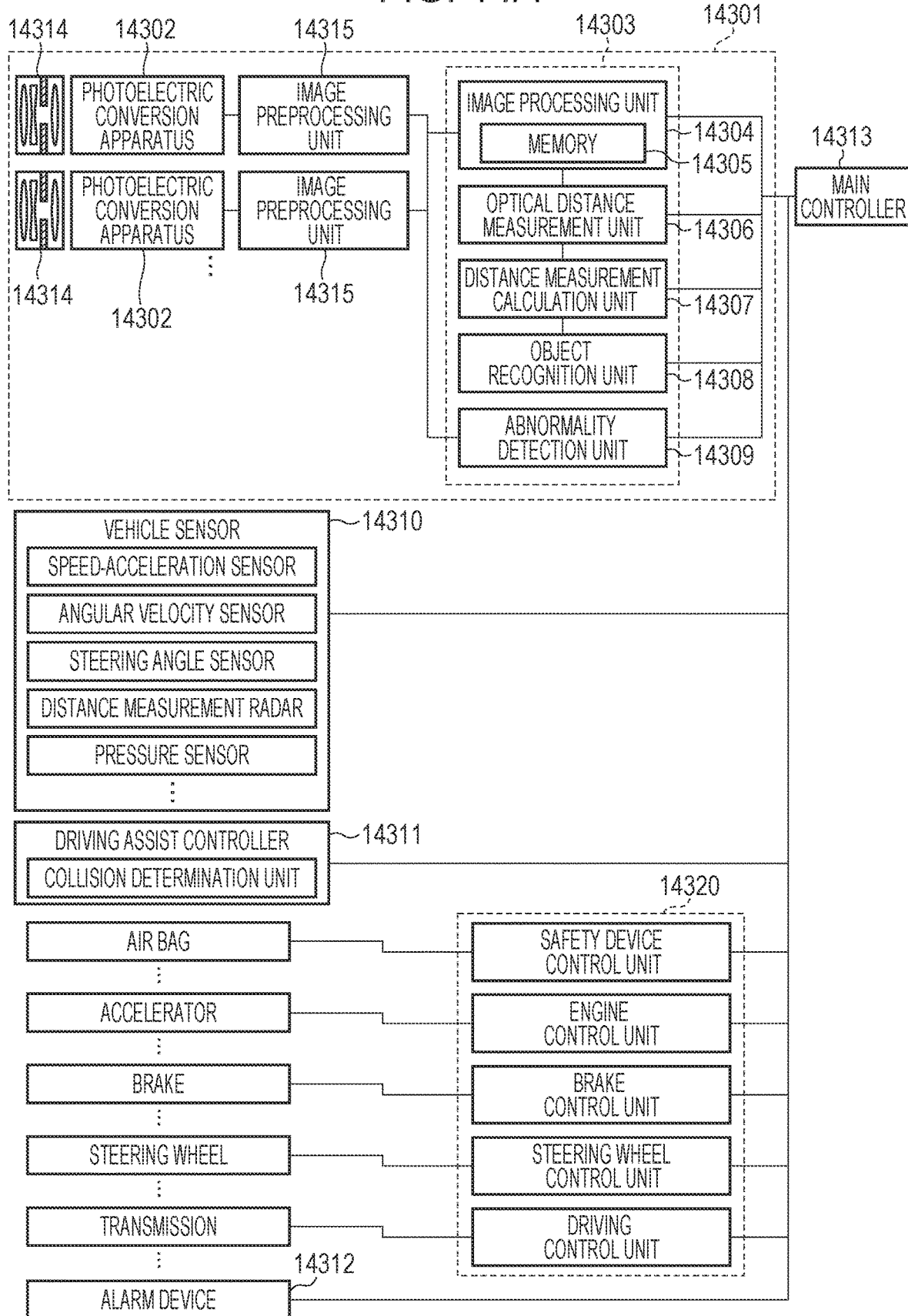
FIGS. 14A and 14B are diagrams illustrating a photoelectric conversion system and a moving object according to a ninth embodiment.
Figure 14B:
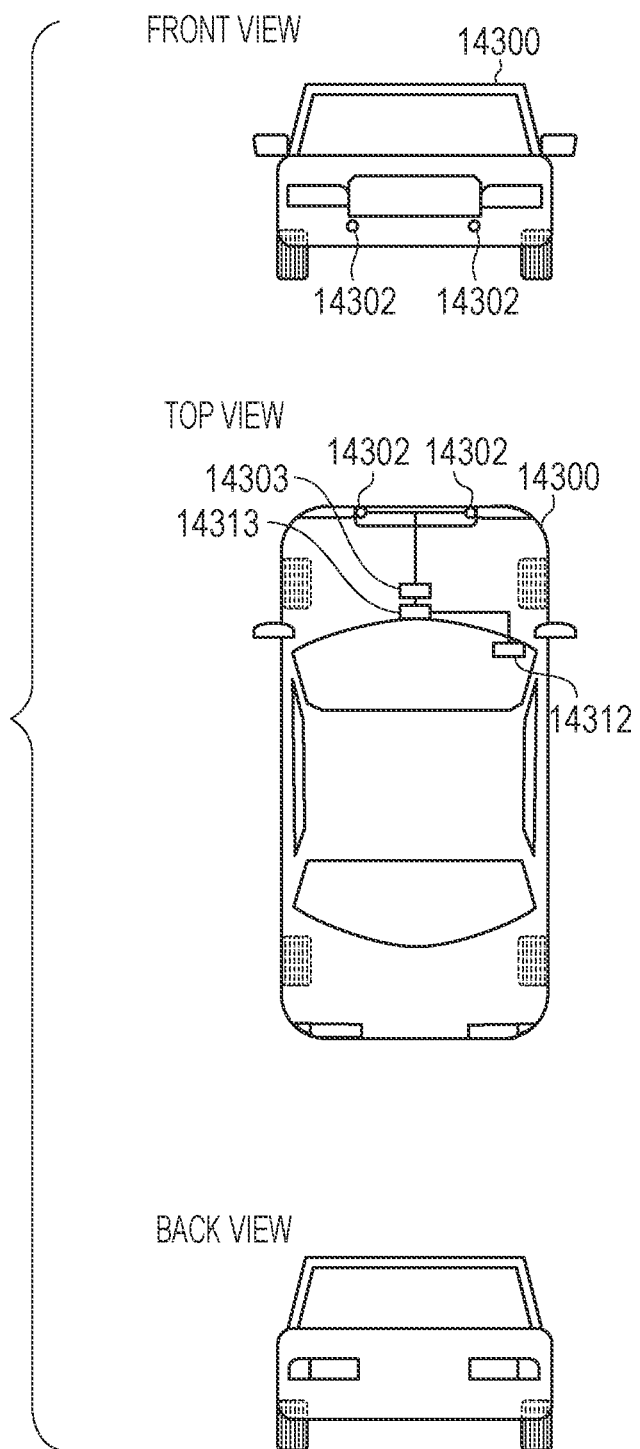

A photoelectric conversion system and a moving object according to the present embodiment will be described using FIGS. 14A and 14B. FIGS. 14A and 14B are schematic diagrams illustrating an example of the configuration of the photoelectric conversion system and an example of the configuration of the moving object according to the present embodiment. In the present embodiment, an example of a vehicle-mounted camera is illustrated as the photoelectric conversion system.

FIG. 14A illustrates an example of a vehicle system and an example of the photoelectric conversion system, which is mounted in the vehicle system and captures images. A photoelectric conversion system 14301 includes a photoelectric conversion apparatus 14302, an image preprocessing unit 14315, an integrated circuit 14303, and an optical system 14314. The optical system 14314 forms an optical image of a subject onto the photoelectric conversion apparatus 14302. The photoelectric conversion apparatus 14302 converts the optical image of the subject formed by the optical system 14314 into an electric signal. The photoelectric conversion apparatus 14302 is one of the photoelectric conversion apparatuses according to the above-described embodiments. The image preprocessing unit 14315 performs certain signal processing on the signal output from the photoelectric conversion apparatus 14302. The functions of the image preprocessing unit 14315 may be incorporated into the photoelectric conversion apparatus 14302. The photoelectric conversion system 14301 includes at least two groups each including the optical system 14314, the photoelectric conversion apparatus 14302, and the image preprocessing unit 14315. Outputs from the image preprocessing units 14315 of both groups are input to the integrated circuit 14303.

The integrated circuit 14303 is an integrated circuit for image capturing systems and includes an image processing unit 14304, an optical distance measurement unit 14306, a distance measurement calculation unit 14307, an object recognition unit 14308, and an abnormality detection unit 14309. The image processing unit 14304 includes a memory 14305. The image processing unit 14304 performs image processing such as development processing or defect correction on an output signal from the image preprocessing unit 14315. The memory 14305 is a primary storage for captured images and stores positions of defective pixels of the captured images. The optical distance measurement unit 14306 brings a subject into focus or measures a distance. The distance measurement calculation unit 14307 calculates distance measurement information from a plurality of pieces of image data acquired by the plurality of photoelectric conversion apparatuses 14302. The object recognition unit 14308 recognizes a subject such as a car, a road, a signpost, a person, or the like. When the abnormality detection unit 14309 detects an abnormality of one of the photoelectric conversion apparatuses 14302, the abnormality detection unit 14309 notifies a main controller 14313 of the abnormality.

The integrated circuit 14303 may be realized by a hardware device designed in a dedicated manner, by a software module, or by a combination of a hardware device and a software module. The integrated circuit 14303 may also be realized by, for example, a field-programmable gate array (FPGA) or an application-specific integrated circuit (ASIC) or may also be realized by a combination of an FPGA and an ASIC.

The main controller 14313 performs central control on operations of the photoelectric conversion system 14301, a vehicle sensor 14310, a control unit 14320, and so forth. Each of the photoelectric conversion system 14301, the vehicle sensor 14310, and the control unit 14320 may have a communication interface without provision of the main controller 14313. A method can also be used in which each of the photoelectric conversion system 14301, the vehicle sensor 14310, and the control unit 14320 performs transmission and reception through the communication network (for example, the CAN standard).

The integrated circuit 14303 has the function of transmitting a control signal or a setting value to the photoelectric conversion apparatuses 14302 upon receiving a control signal from the main controller 14313 or by using its controller.

The photoelectric conversion system 14301 is connected to the vehicle sensor 14310. The vehicle sensor 14310 can detect the driving state of the vehicle having the vehicle sensor 14310 such as a vehicle speed, a yaw rate, and a steering angle and detect the state of the external environment of the vehicle or the states of other cars and obstructions. The vehicle sensor 14310 also serves as a distance information acquisition unit configured to acquire information regarding the distance to a target object. The photoelectric conversion system 14301 is also connected to a driving assist controller 14311, which realizes various types of driving assistance functions such as automatic steering, automatic cruising, and collision avoidance. In particular, regarding a collision determination function, whether the vehicle is likely to collide with or has collided with another car or an obstruction is determined on the basis of a detection result from the photoelectric conversion system 14301 or the vehicle sensor 14310. As a result, collision avoidance control is performed in a case where a collision is likely to happen, or a safety device is activated at the time of collision.

The photoelectric conversion system 14301 is also connected to an alarm device 14312, which alerts the driver on the basis of a determination result from a collision determination unit included in the driving assist controller 14311. For example, in a case where the chances of a collision are high based on a determination result from the collision determination unit, the main controller 14313 performs vehicle control to avoid a collision or reduce damage by braking, releasing the accelerator, controlling the engine output, or the like.

The alarm device 14312 alerts the user by going off an alarm such as certain sound, displaying alarm information on the screen of a display unit of a car navigation system or a meter panel, or vibrating their seat belt or the steering wheel.

In the present embodiment, images around the vehicle, for example, images of views in front of or behind the vehicle are captured by the photoelectric conversion system 14301. FIG. 14B illustrates an example of the photoelectric conversion system 14301 arranged for a case where images of views in front of the vehicle are captured by the photoelectric conversion system 14301.

The two photoelectric conversion apparatuses 14302 are arranged at the front of a vehicle 14300. Specifically, a center line in the forward-backward direction of the vehicle 14300 or with respect to the outside shape of the vehicle 14300 (for example, the width of the vehicle) is treated as a symmetry axis, and the two photoelectric conversion apparatuses 14302 are arranged to have line symmetry with respect to the symmetry axis. This form is used in a case where information regarding the distance between the vehicle 14300 and a subject target is to be acquired or a case where a determination regarding the likelihood of a collision is to be made.

In one embodiment, the photoelectric conversion apparatuses 14302 are to be arranged so as not to block the driver's view when the driver checks the situation outside the vehicle 14300 from the driver's seat. The alarm device 14312 is to be arranged such that the alarm device 14312 is likely to be in the driver's view.

In the present embodiment, control for preventing the vehicle from colliding with other vehicles has been described. However, the photoelectric conversion system 14301 can also be applied to perform, for example, control under which the vehicle drives autonomously so as to follow other vehicles or control under which the vehicle drives autonomously so as not to drive out of the lane. Furthermore, the photoelectric conversion system 14301 can be applied not only to vehicles such as the vehicle having the photoelectric conversion system 14301 but also to, for example, moving objects (moving apparatuses) such as vessels, airplanes, or industrial robots. In addition, the photoelectric conversion system 14301 can be applied not only to the moving objects but also to equipment used to recognize objects in a wide region such as an intelligent transportation system (ITS).

The photoelectric conversion apparatuses according to the disclosure may be configured to be able to further acquire various types of information such as distance information.

Tenth Embodiment

Figure 15A:
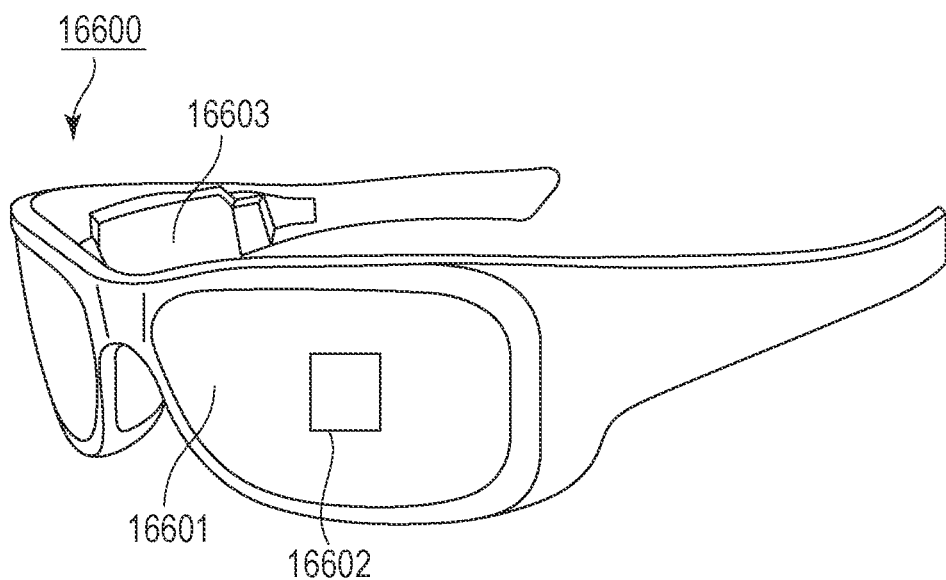
FIGS. 15A and 15B are schematic diagrams of smart glasses according to a tenth embodiment.

FIG. 15A illustrates glasses 16600 (smart glasses) according to one application. The glasses 16600 have a photoelectric conversion apparatus 16602. The photoelectric conversion apparatus 16602 is one of the photoelectric conversion apparatuses according to the above-described embodiments.

A display device including a luminescent device such as an organic light-emitting diode (OLED) or an LED may be provided on the back side of a lens 16601. There may be one photoelectric conversion apparatus 16602 or more. Alternatively, a plurality of types of photoelectric conversion apparatuses may be combined and used. The photoelectric conversion apparatus 16602 does not have to be arranged at the position illustrated in FIG. 15A.

The glasses 16600 further have a control device 16603. The control device 16603 functions as a power source that supplies power to the photoelectric conversion apparatus 16602 and the display device described above. The control device 16603 controls the operation of the photoelectric conversion apparatus 16602 and the display device. In the lens 16601, an optical system is formed that concentrate light onto the photoelectric conversion apparatus 16602.

Figure 15B:
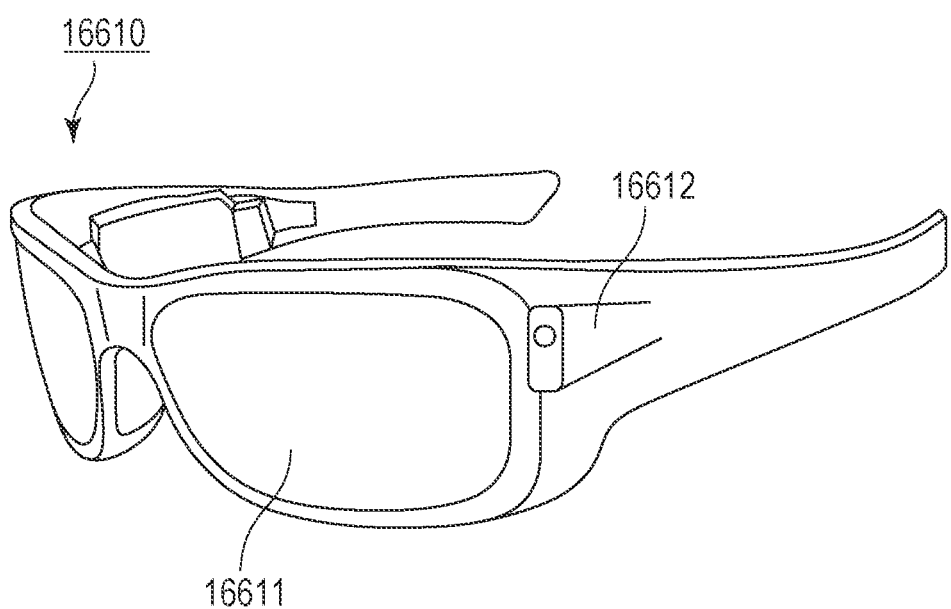

FIG. 15B illustrates glasses 16610 (smart glasses) according to one application.

The glasses 16610 have a control device 16612. The control device 16612 includes a photoelectric conversion apparatus corresponding to the photoelectric conversion apparatus 16602 and a display device. In a lens 16611, an optical system is formed that projects light emitted from the photoelectric conversion apparatus and the display device included in the control device 16612. An image is projected onto the lens 16611. The control device 16612 functions as a power source that supplies power to the photoelectric conversion apparatus and the display device, and controls the operation of the photoelectric conversion apparatus and the display device. The control device 16612 may have a line-of-sight detection unit configured to detect the line of sight of the wearer. Infrared rays may be used to detect the line of sight of the wearer. An infrared-emitting unit emits infrared light to an eyeball of the user gazing at a displayed image. An image of their eyeball is captured by an image capturing unit, which has a light reception element, detecting reflected light of the emitted infrared light from their eyeball. A decrease in the quality of images is reduced by provision of a reduction unit that reduces the amount of light from the infrared-emitting unit to a display unit in a plan view.

The line of sight of the user to the displayed image is detected from the image of their eyeball captured through image capturing using infrared light. A freely chosen known method can be applied to line-of-sight detection using a captured image of their eyeball. As an example, a line-of-sight detection method based on Purkinje images generated by reflected illumination light from the user's cornea can be used.

More specifically, line-of-sight detection processing based on a pupil-corneal reflection method is performed. The line of sight of the user is detected by calculating, using a pupil-corneal reflection method, a line-of-sight vector representing the orientation of their eyeball (a rotation angle) on the basis of an image of their pupil and Purkinje images included in a captured image of their eyeball.

The display device according to the present embodiment has a photoelectric conversion apparatus having a light reception element, and may control an image displayed on the display device on the basis of information regarding the user's line of sight from the photoelectric conversion apparatus.

Specifically, for the display device, a first line-of-sight region, at which the user gazes, and a second line-of-sight region other than the first line-of-sight region are determined on the basis of the line-of-sight information. The first line-of-sight region and the second line-of-sight region may be determined by the control device of the display device. Alternatively, the first line-of-sight region and the second line-of-sight region determined by an external control device may be received. In a display region of the display device, the display resolution of the first line-of-sight region may be controlled to be higher than that of the second line-of-sight region. That is, the resolution of the second line-of-sight region may be made lower than that of the first line-of-sight region.

The display region has a first display region and a second display region, which is different from the first display region. A prioritized region may be determined from among the first display region and the second display region on the basis of the line-of-sight information. The first display region and the second display region may be determined by the control device of the display device. Alternatively, the first display region and the second display region determined by an external control device may be received. The resolution of the prioritized region may be controlled to be higher than that of the region other than the prioritized region. That is, the resolution of the region having a relatively low priority may be reduced.

Note that artificial intelligence (AI) may be used to determine the first line-of-sight region or the prioritized region. AI may be a model configured to use an image of a user's eyeball and the direction in which their eyeball in the image actually sees as supervised data and to estimate the angle of the line of sight from an image of a user's eyeball and the distance to a target ahead of the line of sight. The display device, the photoelectric conversion apparatus, or an external device may have an AI program. In a case where an external device has the AI program, the angle of the line of sight of the user and the distance to the target are transferred to the display device through communication.

In a case where display control is performed on the basis of visual recognition and detection, the present embodiment can be applied to smart glasses further having a photoelectric conversion apparatus that captures an outside image. The smart glasses can display, in real time, outside information regarding a captured outside image.

Eleventh Embodiment

A system according to the present embodiment will be described with reference to FIG. 16. The present embodiment can be applied to a pathological diagnosis system with which a doctor makes a diagnosis of a lesion by observing cells or tissue extracted from a patient or to a diagnosis support system that supports the pathological diagnosis system. The system according to the present embodiment may make a diagnosis of a lesion on the basis of an acquired image or may support making of a diagnosis.

Figure 16:
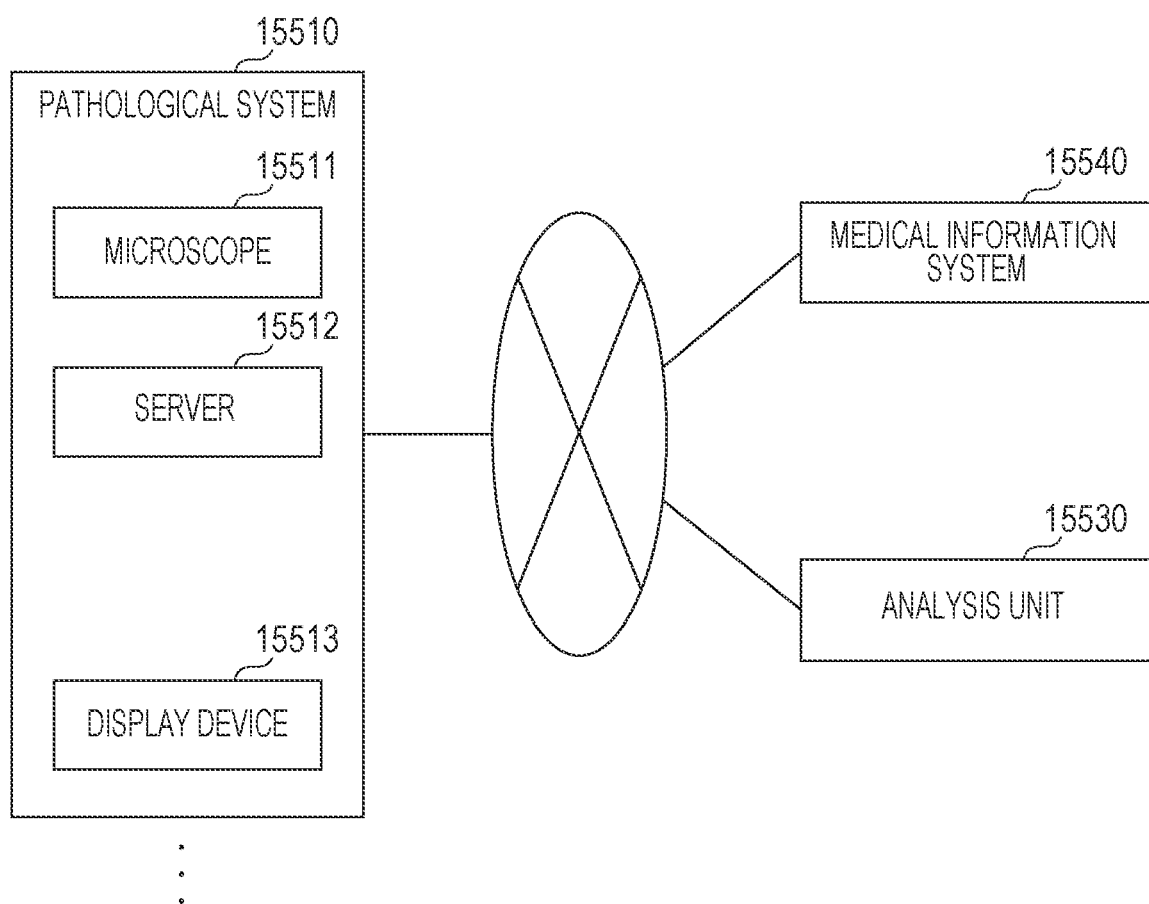
FIG. 16 is a functional block diagram of a diagnosis system according to an eleventh embodiment.

As illustrated in FIG. 16, the system according to the present embodiment includes one or more pathological systems 15510. The system according to the present embodiment may further include an analysis unit 15530 and a medical information system 15540.

Each of the one or more pathological systems 15510 is a system mainly used by pathologists, and is installed in, for example, a research laboratory or a hospital. The pathological systems 15510 may be installed in different hospitals in a respective manner and are each connected to the analysis unit 15530 and the medical information system 15540 via various types of network such as a wide area network or a local area network.

Each pathological system 15510 includes a microscope 15511, a server 15512, and a display device 15513.

The microscope 15511 functions as an optical microscope. The microscope 15511 captures an image of an observation target placed between microscope glass slides to acquire a pathological image, which is a digital image. The observation target is, for example, tissue or cells extracted from a patient and may be a piece of tissue from one of their organs, saliva, blood, or the like.

The server 15512 records and stores pathological images acquired by the microscope 15511 into a storage unit that is not illustrated. In a case where a browsing request is accepted, the server 15512 retrieves pathological images stored in the memory or the like and can display the retrieved pathological images on the display device 15513. A device or the like that controls display may be interposed between the server 15512 and the display device 15513.

In this case, in a case where the observation target is a solid such as a piece of tissue from one of their organs, this observation target may be, for example, a colored thin section. The thin section may be produced, for example, by thinly slicing a block piece cut out from a sample such as one of their organs. To thinly slice the block piece, the block piece may be fixed using paraffin or the like.

The microscope 15511 may include a low resolution image capturing unit for capturing low resolution images and a high resolution image capturing unit for capturing high resolution images. The low resolution image capturing unit and the high resolution image capturing unit may use different optical systems or the same optical system. In a case where the low resolution image capturing unit and the high resolution image capturing unit use the same optical system, the microscope 15511 may be caused to change the resolution in accordance with an image capturing target.

An observation target is placed between microscope glass slides or the like, and is placed on the stage positioned within the angle of view of the microscope 15511. The microscope 15511 first acquires an overall image within the angle of view using the low resolution image capturing unit, and specifies an observation target region from the acquired overall image. Next, the microscope 15511 divides the region where the observation target is present into a plurality of division regions of a predetermined size, and acquires high resolution images of the division regions by sequentially capturing an image of each division region using the high resolution image capturing unit. When a target division region is switched, the stage may be moved, the imaging optical system may be moved, or both of the stage and the imaging optical system may be moved. Each division region may overlap adjacent division regions in order to prevent the occurrence of regions that are not subjected to image capturing due to unintentional slipping of the microscope glass slides. Furthermore, the overall image may include identification information used to associate the overall image with the patient. This identification information may be, for example, a character string or a Quick Response (QR) code (registered trademark).

High resolution images acquired by the microscope 15511 are input to the server 15512. The server 15512 can divide each high resolution image into partial images having a smaller size. In a case where the partial images are generated in this manner, the server 15512 performs composition processing, in which one image is generated by combining a predetermined number of partial images adjacent to each other, on every partial image. This composition processing may be repeated until one partial image is generated at last. Through such processing, a group of partial images having a pyramid structure is formed, the pyramid structure having layers each of which is formed by one or more partial images. In this pyramid structure, the number of pixels of each partial image in a layer is equal to that in another layer different from the layer; however, the resolutions are different from each other. For example, in a case where one partial image of an upper layer is generated by combining four partial images, which are (2×2) partial images, the resolution of the partial image of the upper layer is half that of the partial images of the lower layer used in composition.

By constructing a group of partial images having such a pyramid structure, it becomes possible to change the level of detail of the observation target displayed on the display device depending on the layer to which a tile image of a display target belongs. For example, in a case where a partial image of the lowest layer is used, a narrow region of the observation target is displayed in detail. A wider region of the observation target can be displayed with a lower resolution the nearer a partial image that is used is to the upper side.

The generated group of partial images having a pyramid structure can be stored in, for example, a memory or the like. In a case where the server 15512 receives a request for acquisition of a partial image including identification information from another apparatus (for example, the analysis unit 15530), the server 15512 transmits the partial image corresponding to the identification information to the other apparatus.

Note that a partial image, which is a pathological image, may be generated on an imaging condition basis such as a focal length basis or a coloring condition basis. In a case where a partial image is generated on an imaging condition basis, a specific pathological image and another pathological image corresponding to an imaging condition different from a specific imaging condition may be displayed next to each other, the specific pathological image and the other pathological image displaying the same region. The specific imaging condition may be specified by a viewer. In a case where a plurality of imaging conditions are specified by a viewer, pathological images corresponding to the individual imaging conditions and displaying the same region may be displayed next to each other.

The server 15512 may also store the group of partial images having a pyramid structure in a storage device other than the server 15512. Examples of the storage device include a cloud server. Furthermore, part of the entirety of partial image generation processing as described above may be executed by a cloud server or the like. By using partial images in this manner, the user can feel as if they are observing the observation target while changing the observation magnification. That is, by controlling display, the pathological system 15510 can be made to serve as a virtual microscope. A virtual observation magnification in this case actually corresponds to a resolution.

The medical information system 15540 is a so-called electronic medical record system, and stores information for identifying patients, information regarding disorders of the patients, examination information and image information used to make diagnoses, diagnosis results, and information regarding diagnoses such as prescriptions. For example, a pathological image obtained by capturing an image of an observation target of a certain patient is temporarily stored via the server 15512 and thereafter may be displayed on the display device 15513. A pathologist using one of the pathological systems 15510 makes pathological diagnoses on the basis of pathological images displayed on the display device 15513. The pathological diagnosis results made by the pathologist are stored in the medical information system 15540.

The analysis unit 15530 may analyze pathological images. To perform this analysis, a learning model generated through machine learning can be used. The analysis unit 15530 may output a classification result of a specific region, an identification result of tissue, or the like as its analysis result. Furthermore, the analysis unit 15530 may output, for example, identification results such as cell information, the number of cells, the positions of cells, or luminance information, or scoring information corresponding to these identification results. These pieces of information obtained from the analysis unit 15530 may be displayed, as diagnosis support information, on the display device 15513 of the pathological system 15510.

Note that the analysis unit 15530 may be a server system including one or more servers (including a cloud server). Moreover, the analysis unit 15530 may be incorporated in, for example, the server 15512 inside the pathological system 15510. That is, various types of analysis of pathological images may be performed inside the pathological system 15510.

The photoelectric conversion apparatuses described in the above-described embodiments can be applied to, for example, the microscope 15511 among the configurations described above. Specifically, the photoelectric conversion apparatuses described in the above-described embodiments can be applied to the low resolution image capturing unit, the high resolution image capturing unit, or both the low resolution image capturing unit and the high resolution image capturing unit in the microscope 15511. As a result, the low resolution image capturing unit, the high resolution image capturing unit, or both the low resolution image capturing unit and the high resolution image capturing unit can be reduced in size, which leads to size reduction of the microscope 15511. As a result, it becomes easier to transport the microscope 15511, and thus it becomes easier to install the microscope 15511 in a system, to perform a system rearrangement, or the like. Furthermore, by applying any one of the photoelectric conversion apparatuses described in the above-described embodiments, part or the entirety of processing from acquisition to analysis of a pathological image can be performed on the fly inside the microscope 15511. Thus, it becomes possible to output diagnosis support information more promptly and more accurately.

Note that the configurations described above can be applied not only to diagnosis support systems but also to general biological microscopes such as confocal microscopes, fluorescence microscopes, and video microscopes. In this case, an observation target may be a biological sample such as a cultured cell, a zygote, or a sperm, a biomaterial such as a cell sheet or three-dimensional cellular tissue, or a living body such as a zebrafish or a mouse. Moreover, the observation target can be observed not only in a state of being placed between microscope glass slides but also in a state of being stored in a microplate or a Petri dish.

Furthermore, a moving image may be generated from still images of the observation target acquired using a microscope. For example, a moving image may be generated from still images captured successively over a predetermined period, or an image sequence may be generated from still images captured at certain intervals. By generating a moving image from still images in this manner, dynamic characteristics of the observation target can be analyzed using machine learning. Examples of the dynamic characteristics include actions such as beating, elongating, or wandering of a cancer cell, a nerve cell, myocardial tissue, or a sperm and a splitting process of a cultured cell or a zygote.

Other Embodiments

In the above-described embodiments, for each color, inputs to the AI processing unit corresponding to the color may include pixel outputs of the corresponding color obtained by performing Bayer interpolation for pixel positions of the other colors. In the above-described embodiments, for example, in a case where one of the green color filters or the green color filter is arranged at a first pixel, and the red color filter is arranged at a second pixel, an output from the first pixel is processed by the AI processing unit for green. An output from the second pixel is processed by the AI processing unit for red. However, there may be a case where interpolation processing is performed in which green luminance information is acquired from the first pixel, and the green luminance information is allocated to the second pixel. In this case, for example, the AI processing unit appropriate for processing green luminance information performs signal processing not only on the green luminance information on the first pixel but also on the green luminance information on the second pixel obtained from the interpolation processing. That is, luminance information on the second pixel and regarding a wavelength corresponding to a certain filter of the first pixel is acquired from an output signal from a first photoelectric conversion unit of the first pixel provided with the certain filter. The AI processing unit that processes an output from the first photoelectric conversion unit performs signal processing on the acquired luminance information on the second pixel.

Moreover, the arrangement of the AI processing units corresponding to the individual colors is not limited to the arrangements described in the above-described embodiments. Specifically, the examples have been described in which the AI processing units are placed above and under the read-out circuit 301; however, examples are also possible in which the AI processing units are placed to the left and to the right of the read-out circuit 301. Even with such configurations, the technical effects described in the above-described embodiments can be obtained.

Furthermore, regarding the arrangement of the memories in which the learned models for the AI processing units are stored, the arrangement of the memories may be selected as appropriate. For example, the memories may be collectively arranged at one position or may be individually arranged so as to correspond respective pieces of processing.

Regarding the embodiments described above, some configurations can be exchanged with each other. A configuration of one of the embodiments may be added to the other embodiments, or a configuration of one of the embodiments may be omitted. That is, any combinations or modifications are possible among the embodiments.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-016451, filed Feb. 4, 2021, which is hereby incorporated by reference herein in its entirety.

What is claimed is:

1. A photoelectric conversion apparatus comprising:
  a photoelectric conversion region in which a plurality of photoelectric conversion units are arranged;

a first filter arranged so as to correspond to a first photoelectric conversion unit among the plurality of photoelectric conversion units;

a second filter arranged so as to correspond to a second photoelectric conversion unit among the plurality of photoelectric conversion units and having a different optical property from the first filter;

a first processing unit configured to process an output signal from the first photoelectric conversion unit and having a first learned model; and a second processing unit configured to process an output signal from the second photoelectric conversion unit and having a second learned model different from the first learned model, wherein the photoelectric conversion region is provided on a first substrate, the first processing unit and the second processing unit are provided on a second substrate, the first substrate and the second substrate are stacked one on top of one another, wherein, in a plan view, a distance between the first processing unit and a boundary of the photoelectric conversion region is longer than a distance between the second processing unit and the boundary of the photoelectric conversion region.

2. The photoelectric conversion apparatus according to claim 1, wherein
the first filter is provided so that the first photoelectric conversion unit receives light of an infrared region, and
the second filter is provided so that the second photoelectric conversion unit receives light of a visible light region.

3. The photoelectric conversion apparatus according to claim 1, wherein
the first filter is provided so that the first photoelectric conversion unit receives green light, and
the second filter is provided so that the second photoelectric conversion unit receives red or blue light.

4. The photoelectric conversion apparatus according to claim 1, wherein
the first learned model is a learned model that processes luminance information obtained from an output signal from the first photoelectric conversion unit, and
the second learned model is a learned model that processes color information obtained from an output signal from the second photoelectric conversion unit.

5. The photoelectric conversion apparatus according to claim 1, further comprising:
a processing unit configured to combine an output from the first processing unit with an output from the second processing unit.

6. The photoelectric conversion apparatus according to claim 1,
wherein, in a plan view, an area occupied by the first processing unit is larger than an area occupied by the second processing unit.

7. The photoelectric conversion apparatus according to claim 1, further comprising:
a first pixel provided with the first photoelectric conversion unit; and
a second pixel provided with the second photoelectric conversion unit, wherein
luminance information on the second pixel and regarding a wavelength corresponding to the first filter is acquired from an output signal from the first photoelectric conversion unit, and the first processing unit processes the luminance information on the second pixel.

8. A photoelectric conversion system comprising:
the photoelectric conversion apparatus according to claim 1; and
a signal processing unit configured to generate an image using a signal output from the photoelectric conversion apparatus.

9. A moving body provided with the photoelectric conversion apparatus according to claim 1, the moving body comprising:
a controller configured to control movement of the moving body using a signal output from the photoelectric conversion apparatus.

10. A photoelectric conversion apparatus comprising:
a photoelectric conversion region in which a plurality of photoelectric conversion units are arranged;
a first filter arranged so as to correspond to a first photoelectric conversion unit among the plurality of photoelectric conversion units;
a second filter arranged so as to correspond to a second photoelectric conversion unit among the plurality of photoelectric conversion units and having a different optical property from the first filter;
a first processing unit configured to process an output signal from the first photoelectric conversion unit and having a first learned model; and
a second processing unit configured to process an output signal from the second photoelectric conversion unit and having a second learned model different from the first learned model,
wherein the photoelectric conversion region is provided on a first substrate,
the first processing unit and the second processing unit are provided on a second substrate,
the first substrate and the second substrate are stacked one on top of one another, and
wherein, in a plan view, an area of an overlapping region of the first processing unit and the photoelectric conversion region is smaller than an area of an overlapping region of the second processing unit and the photoelectric conversion region.

11. The photoelectric conversion apparatus according to claim 10, wherein
the first filter is provided so that the first photoelectric conversion unit receives light of an infrared region, and
the second filter is provided so that the second photoelectric conversion unit receives light of a visible light region.

12. The photoelectric conversion apparatus according to claim 10, wherein
the first filter is provided so that the first photoelectric conversion unit receives green light, and
the second filter is provided so that the second photoelectric conversion unit receives red or blue light.

13. The photoelectric conversion apparatus according to claim 10, wherein
the first learned model is a learned model that processes luminance information obtained from an output signal from the first photoelectric conversion unit, and
the second learned model is a learned model that processes color information obtained from an output signal from the second photoelectric conversion unit.

14. The photoelectric conversion apparatus according to claim 10, further comprising:

a processing unit configured to combine an output from the first processing unit with an output from the second processing unit.

15. A photoelectric conversion system comprising:
the photoelectric conversion apparatus according to claim 10; and
a signal processing unit configured to generate an image using a signal output from the photoelectric conversion apparatus.

16. A moving body provided with the photoelectric conversion apparatus according to claim 10, the moving body comprising:
a controller configured to control movement of the moving body using a signal output from the photoelectric conversion apparatus.

* * * * *